(12) United States Patent
Saito

(10) Patent No.: US 8,860,145 B2
(45) Date of Patent: Oct. 14, 2014

(54) SEMICONDUCTOR DEVICE, INTEGRATED CIRCUIT INCLUDING THE SEMICONDUCTOR DEVICE, CONTROL IC FOR SWITCHING POWER SUPPLY AND THE SWITCHING POWER SUPPLY

(75) Inventor: Masaru Saito, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 11/943,573

(22) Filed: Nov. 20, 2007

(65) Prior Publication Data

US 2008/0117653 A1    May 22, 2008

(30) Foreign Application Priority Data

Nov. 20, 2006 (JP) .................... 2006-312757

(51) Int. Cl.
*H01L 27/11* (2006.01)

(52) U.S. Cl.
USPC .................... 257/379; 257/E27.016

(58) Field of Classification Search
USPC ......... 257/134, 287, 401, 488, 489, 492, 493, 257/E29.009, E29.011, E29.012, E29.256, 257/E29.258
See application file for complete search history.

(56) References Cited

U.S. PATENT DOCUMENTS

| | | | |
|---|---|---|---|
| 5,477,175 A | 12/1995 | Tisinger et al. | |
| 6,492,689 B2 | 12/2002 | Yamauchi et al. | |
| 6,743,669 B1 * | 6/2004 | Lin et al. | 438/238 |
| 2001/0048122 A1 * | 12/2001 | Tada et al. | 257/240 |
| 2005/0077551 A1 | 4/2005 | Halamik et al. | |
| 2005/0201123 A1 | 9/2005 | Usui et al. | |
| 2006/0163691 A1 * | 7/2006 | Hall et al. | 257/528 |
| 2007/0221963 A1 | 9/2007 | Saito et al. | |
| 2009/0323376 A1 | 12/2009 | Saito | |
| 2011/0228575 A1 | 9/2011 | Saito et al. | |

FOREIGN PATENT DOCUMENTS

| | | |
|---|---|---|
| JP | 08140355 A | 5/1996 |
| JP | 11-150234 A | 2/1999 |
| JP | 2000-252426 A | 9/2000 |
| JP | 2001-007121 A | 1/2001 |
| JP | 2001-044431 A | 2/2001 |
| JP | 2001086663 A | 3/2001 |
| JP | 2001-313367 A | 11/2001 |
| JP | 2002165452 A | 6/2002 |
| JP | 2005-093696 A | 4/2005 |

(Continued)

OTHER PUBLICATIONS

Notification of Reasons for Refusal for corresponding JP 2007-299872, dated May 14, 2013. Partial translation provided.

(Continued)

*Primary Examiner* — Vongsavanh Sengdara
(74) *Attorney, Agent, or Firm* — Rossi, Kimms & McDowell LLP

(57) ABSTRACT

A semiconductor device incorporates a resistor on a structure that uses diffusion layers for sustaining the breakdown voltage thereof to realizes a very resistive element that exhibits a high breakdown voltage and high electrical resistance, includes a spiral very resistive element buried in an interlayer insulator film. A first end of the very resistive element is connected to a drain electrode wiring and the second end of the very resistive element is grounded. An intermediate point of the very resistive element is connected to ae voltage comparator of a control IC. The semiconductor device according to the invention facilitates reducing the components parts costs, assembly costs and size of a switching power supply that includes a very resistive element.

10 Claims, 20 Drawing Sheets

(56) References Cited

FOREIGN PATENT DOCUMENTS

| | | |
|---|---|---|
| JP | 2005-094835 A | 4/2005 |
| JP | 2005-268319 A | 9/2005 |
| JP | 2006204082 A | 8/2006 |
| JP | 2007509493 A | 4/2007 |
| JP | 2007258554 A | 10/2007 |
| WO | 03103121 A1 | 12/2003 |
| WO | 2005040952 A2 | 5/2005 |

OTHER PUBLICATIONS

Japanese Office Action in Japanese counterpart application No. JP2013242561, dated Aug. 12, 2014. English translation provided.

* cited by examiner

Y-Y' CROSS SECTION

Z-Z' CROSS SECTION

Y-Y' CROSS SECTION

Z-Z' CROSS SECTION

SEMICONDUCTOR DEVICE, INTEGRATED CIRCUIT INCLUDING THE SEMICONDUCTOR DEVICE, CONTROL IC FOR SWITCHING POWER SUPPLY AND THE SWITCHING POWER SUPPLY

BACKGROUND

The present invention relates to a semiconductor device, an integrated circuit including the semiconductor device, a control IC including the semiconductor device for controlling a switching power supply, and the switching power supply.

A control IC for controlling a switching power supply (hereinafter referred to simply as the "control IC") is an exclusive IC for controlling individual switching transistors exhibiting a high breakdown voltage. The control IC obtains the power supply thereof by making the switching transistors work in the operating state thereof. However, it is necessary to feed a starting current from a starter circuit to the control IC at the start thereof. Usually, the starter circuit is incorporated into a semiconductor substrate, into which the control IC is incorporated, to decrease the component parts and to simplify the power supply system.

The starting current is obtained by rectifying an AC input signal of 100 to 240 V. In order to feed the starting current obtained as described above to the starter circuit, it is necessary for a device of normally-on-type (hereinafter referred to as the "normally-on device") disposed in the front stage of the starter circuit to exhibit a breakdown voltage of 450 V or higher. For integrating the normally-on device and the control IC monolithically into a unit, the normally-on device is implemented in the form of a lateral junction-type field effect transistor exhibiting a high breakdown voltage. Hereinafter the junction-type field effect transistor will be referred to as a "JFET". The current driving capability of the JFET determines the design specifications, based on which a switching power supply is designed.

FIG. 11 and FIG. 12 are block circuit diagrams of conventional switching power supplies. The configuration shown in FIG. 11 rectifies and makes an AC input smooth and feeds the rectified and smooth input to input terminal 232, the breakdown voltage thereof is high, (hereinafter referred to as "VH terminal 232") of control IC 231. The configuration shown in FIG. 12 conducts half-wave rectification of an AC input and feeds the rectified input to VH terminal 232.

As shown in FIG. 11 or 12, the switching power supply conducts full-wave rectification of the AC input, supplied commercially for example, with rectifier 202 and charges power supply capacitor 203 with the DC voltage obtained by the full-wave rectification. The switching power supply makes control IC 231 control the ON and OFF of MOSFET 219, working as a switching device and connected to primary coil 206 of transformer 205, to induce a voltage based on the voltage of power supply capacitor 203 across secondary coil 208 of transformer 205. The switching power supply rectifies and makes the induced voltage smooth and feeds the rectified and smooth voltage to a load (not shown).

As the plug of the switching power supply is pulled out from a receptacle and the power supply from the AC input is interrupted, the primary-side input voltage lowers. If the switching power supply keeps operating in this state, the ON-period of MOSFET 219 is prolonged, causing heat generation in MOSFET 219. To prevent this problem from occurring, the switching power supply is provided with a brownout function that stops the switching operation of the power supply when the input voltage lowers.

In order to realize the brownout function in the conventional switching power supply shown in FIG. 11 or 12, brownout input terminal (hereinafter referred to as "BO terminal") 262 that detects the primary-side voltage of the power supply is disposed on control IC 231. BO terminal 262 and is connected to the intermediate node of a series resistance circuit consisting of two resistors 251 and 252 connected in parallel to power supply capacitor 203.

The primary-side input voltage is divided by resistors 251 and 252, input to brownout comparator (hereinafter referred to as "BO comparator") 244 via BO terminal 262 and compared with a predetermined voltage in BO comparator 244. When the input voltage from BO terminal 262 is lower than the predetermined voltage, the brownout function works to stop the switching operation of MOSFET 219 driven by driver circuit 246.

FIG. 13 is a circuit diagram of a starter circuit used in the conventional switching power supply. As shown in FIG. 13, conventional starter circuit 241 includes input terminal 261 exhibiting a high breakdown voltage (hereinafter referred to as "VH terminal 261"), on/off signal input terminal (hereinafter referred to as "on/off terminal") 263, and power supply voltage terminal (hereinafter referred to as "VCC terminal") 264. Starting device 265 in starter circuit 241 includes first JFET 281 that makes a current flow to VCC terminal (power supply voltage terminal) 235 of control IC 231 via VCC terminal 264 at the start of the power supply and second JFET 282 that keeps NMOS transistor 268 disposed on the current path of first JFET 281 in the ON-state.

In addition to realizing the brownout function, the input voltage from an external wiring is sometimes divided by voltage dividing resistors before the input thereof to a control IC. It is necessary for the voltage dividing resistor connected to the external wiring to exhibit a high breakdown voltage when the external wiring voltage is high. For suppressing the electric power consumed all the time, it is necessary for the voltage dividing resistors to exhibit high electrical resistance. Therefore, a voltage dividing system that uses externally added resistors is usually employed. For example, so-called power-factor-improving circuit 1200 for suppressing higher harmonic currents is sometimes disposed between rectifier 202 and power supply capacitor 203 in FIG. 12.

FIG. 14 is a block circuit diagram of a conventional power-factor-improving circuit. The circuit configured as shown in FIG. 14 charges capacitor 1008 with the DC voltage obtained by rectifying and smoothing an AC input signal (100~240V). The DC voltage of capacitor 1008 that is high is lowered by voltage-dividing resistance circuit 1001 to be low enough to be inputted to control IC 1100 for improving the power factor (hereinafter referred to as a "power-factor-improving IC") and the lowered DC voltage is inputted to input terminal 1101 of power-factor-improving IC 1100. In the same manner, the DC voltage of capacitor 203 that is high is lowered by voltage-dividing resistance circuit 1009 to be low enough to be inputted to power-factor-improving IC 1100 and the lowered DC voltage is inputted to feedback terminal 1102 of power-factor-improving IC 1100. Power-factor-improving IC 1100 generates, based on the signals inputted to input and feedback terminals 1101 and 1102 thereof, a pulse-width-control signal that adjusts the AC current waveform to be similar to the AC voltage waveform. Switching transistor 1005 makes an intermittent current flow through boost inductor 1003. The intermittent current is outputted with the waveform thereof changed to be sinusoidal with rectifier 1007 and capacitor 203. Resistor 1002 is disposed to feed a power supply to power-factor-improving IC 1100. Resistor 1004 is disposed to adjust the gate current of switching transistor 1005. Usually, the resistors described above, the resistors in input-side voltage-dividing-resistance circuit 1001 and the resistors in output-side voltage-dividing-resistance circuit 1009 are added externally.

A switching power supply, which improves the overcurrent detection accuracy in the state, in which an input voltage variation is caused or the input voltage range is changed over, by a configuration that changes the reference signal fed to an overcurrent detecting comparator in response to the variation of the output voltage from an input voltage detector circuit, has been known to persons skilled in the art (See, for example, Unexamined Japanese Patent Application Publication No. 2005-94835). A semiconductor device, which includes a semiconductor substrate, a circular diffusion layer, the potential thereof is floating, on a major surface of the semiconductor substrate, and a resistance layer above the circular diffusion layer with an insulator layer interposed between the resistance layer and the diffusion layer, has been known to persons skilled in the art (See, for example, Unexamined Japanese Patent Application Publication No. 2000-252426). A semiconductor device for the switching regulator, which incorporates therein a starting resistor exhibiting a high breakdown voltage and high resistance, has been known to persons skilled in the art (See, for example, Unexamined Japanese Patent Application Publication No. 2001-313367, Counterpart U.S. Pat. No. 6,492,689).

Since it is necessary to externally add a very resistive element, exhibiting a high breakdown voltage and high electrical resistance (hereinafter referred to simply as a "very resistive element"), to the control IC in the conventional switching power supply described above, the component parts costs and assembly costs thereof increase substantially and the conventional switching power supply is prevented from being reduced in size. Although a very resistive element is necessary for detecting the input voltage in the switching power supply disclosed in Unexamined Japanese Patent Application Publication No. 2005-94835, any concrete configuration is not described thereon. Although a resistance layer working for a starting resistor is formed on the field limiting ring surrounding the active region of the semiconductor chip in the semiconductor device disclosed in the Unexamined Japanese Patent Application Publication No. 2000-252426 and U.S. Pat. No. 6,492,689, the resistance layer is formed not for realizing a brownout function.

In view of the foregoing, it would be desirable to obviate the problems described above. It would be also desirable to provide a switching power supply including a very resistive element, connected to a high voltage that facilitates reducing the component parts costs, the assembly costs and the size thereof. It would be further desirable to provide a semiconductor device necessary for realizing the desirable switching power supply as described above, a semiconductor integrated circuit including the semiconductor device described above and a control IC for controlling the switching power supply.

SUMMARY OF THE INVENTION

The invention provides a semiconductor device that includes a semiconductor substrate of a first conductivity type, a first diffusion layer of a second conductivity type formed in the surface portion of the semiconductor substrate, a second diffusion layer of the first conductivity type formed in the surface portion of the semiconductor substrate, wherein the second diffusion layer is in contact with the first diffusion layer, a very resistive element exhibiting a high breakdown voltage and high electrical resistance formed above the first diffusion layer with a thick oxide film interposed between the very resistive element and the first diffusion layer, an insulator film covering the thick oxide film, the very resistive element and the semiconductor substrate, a first electrode connected electrically to the first diffusion layer and the first end of the very resistive element, a first resistance connection wiring connected to the second end of the very resistive element; and a second electrode connected electrically to the second diffusion layer.

In another embodiment, a semiconductor device is provided that includes a semiconductor substrate of a first conductivity type, a drift region of a second conductivity type formed in the surface portion of the semiconductor substrate, a drain electrode connected to the drift region, a channel region of the first conductivity type formed selectively in the surface portion of the semiconductor substrate, the channel region surrounding the connection point of the drift region and the drain electrode, wherein the channel region is in contact with the drift region, a source region of the second conductivity type formed in the surface portion of the channel region, a source electrode connected to the channel region and the source region, a control electrode controlling a channel formed in the surface portion of the channel region between the drift region and the source region, an insulator film covering the channel region, the source region, and the drift region, a very resistive element exhibiting a high breakdown voltage and high electrical resistance, the very resistive element being buried in the insulator film between the source region and the connection point of the drift region and the drain electrode, the very resistive element including a first end connected to the drain electrode, and a first resistance connection wiring connected to the second end of the very resistive element.

A further embodiment of the invention provides a semiconductor device including a semiconductor substrate of a first conductivity type, a drift region of a second conductivity type formed in the surface portion of the semiconductor substrate, a drain electrode connected to the drift region, a gate region of the first conductivity type formed selectively in the surface portion of the semiconductor substrate, the gate region surrounding the connection point of the drift region and the drain electrode, the gate region being in contact with the drift region, a plurality of source regions of the second conductivity type formed in the surface portion of the semiconductor substrate, the source regions extending into the gate region, a source electrode connected to the source regions, an insulator film covering the gate region, the source regions, and the drift region, a very resistive element exhibiting a high breakdown voltage and high electrical resistance, the very resistive element being buried in the insulator film in the region between the drain electrode and the gate region or in the region between the drain electrode and the source regions, the very resistive element including a first end connected to the drain electrode, a control electrode connected to the gate region, and a first resistance connection wiring connected to the second end of the very resistive element.

The semiconductor device described above preferably includes a drain region of the second conductivity type formed in the surface portion of the semiconductor substrate between the drift region and the drain electrode.

Further, the source electrode includes a first source electrode connected to a part of the source region and a second source electrode connected to the remaining part of the source region.

In addition, the semiconductor device further preferably includes a drain region of the second conductivity type formed in the surface portion of the semiconductor substrate between the drift region and the drain electrode.

Still further, the source electrodes in the semiconductor device may be a first source electrode connected to a first source region group including one or more of the source regions and a second source electrode connected to a second source region group including the remaining one or more of the source regions.

In addition, a second resistance connection wiring may be connected to the intermediate point of the very resistive element.

The resistive element is preferably shaped with a flat spiral and is preferably made of polysilicon.

A semiconductor integrated circuit is also provided that includes an input terminal, thereto a high voltage is inputted, a voltage-dividing resistance circuit dividing the high voltage inputted from the input terminal, the voltage-dividing resistance circuit including a very resistive element exhibiting a high breakdown voltage and a high electrical resistance, and the semiconductor device of the type described above working as the very resistive element.

A control IC for controlling a switching power supply is also provided that includes a starter circuit including a first field effect transistor exhibiting a high breakdown voltage, the first field effect transistor including a drain terminal, thereto a primary-side voltage is applied from the outside, a gate terminal grounded, and a source terminal, therefrom the first field effect transistor makes a current flow based on the primary-side voltage applied to the drain terminal thereof, a switching transistor connected to the source terminal of the first field effect transistor, a second field effect transistor exhibiting a high breakdown voltage, the second field effect transistor including a drain terminal, thereto the primary-side voltage is applied from the outside, a gate terminal grounded, and a source terminal, therefrom the second field effect transistor outputs a control signal to control the switching transistor, and a series resistance circuit including two resistors dividing the primary-side voltage applied to the drain terminals of the first and second field effect transistors. The first field effect transistor, the second field effect transistor and the two resistors are preferably integrated into a semiconductor substrate in the control IC described above.

According to further aspect of the invention, the first field effect transistor, the second field effect transistor and the resistors are configured by a semiconductor device of the type described above and the drain terminal of the first field effect transistor is connected to the drain electrode of the semiconductor device, the gate terminal of the first field effect transistor is connected to the control electrode of the semiconductor device, and the source terminal of the first field effect transistor is connected to the first source electrode of the semiconductor device, the drain terminal of the second field effect transistor is connected to the drain electrode of the semiconductor device, the gate terminal of the second field effect transistor is connected to the control electrode of the semiconductor device, and the source terminal of the second field effect transistor is connected to the second source electrode of the semiconductor device, one of the resistors, thereto the primary-side voltage is applied, is formed of the section of the very resistive element between the connection point thereof with the drain electrode and the connection point thereof with the second resistance connection wiring, and the other one of the resistors grounded is formed of the section of the very resistive element between the connection point thereof with the second resistance connection wiring and the connection point thereof with the first resistance connection wiring. A switching power supply can be constructed incorporating the above-described control IC.

According to the invention, a control IC for controlling a switching power supply that incorporates a very resistive element exhibiting a high breakdown voltage and high electrical resistance therein, especially a control IC that incorporates the very resistive element in a semiconductor substrate, is obtained.

The semiconductor device, the control IC and the switching power supply according to the invention facilitate reducing the component parts costs, assembly costs and size of the switching power supply that includes a very resistive element, exhibiting a high breakdown voltage and high electrical resistance, connected to a high voltage.

BRIEF DESCRIPTION OF THE DRAWINGS

The invention will be described with reference to certain preferred embodiments and the accompanying drawings, wherein.

DETAILED DESCRIPTION OF THE PREFERRED EMBODIMENTS

Figure 1:
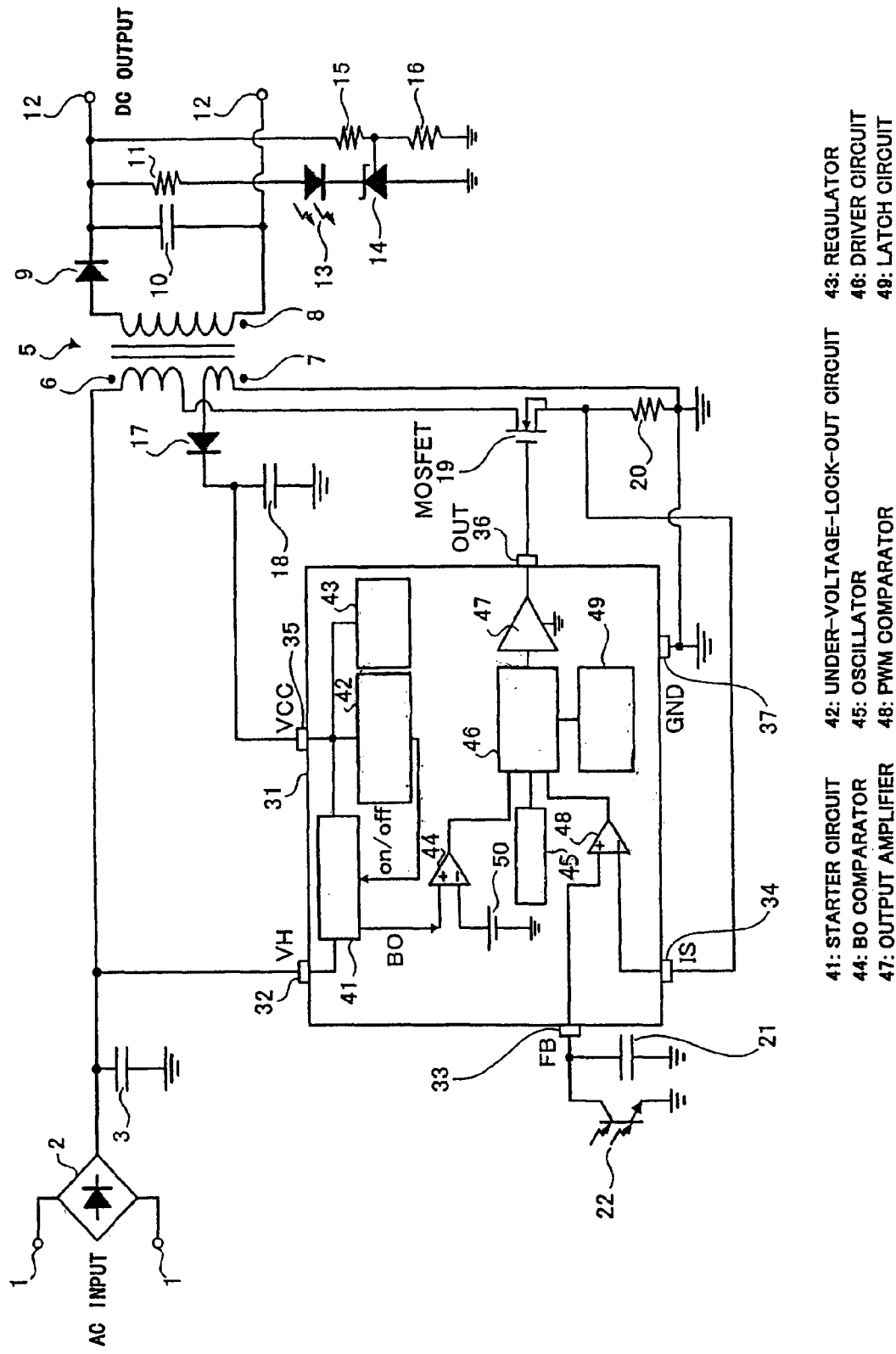
FIG. 1 is a block circuit diagram of a switching power supply according to a second embodiment of the invention.

The invention will be described in detail hereinafter with reference to the accompanied drawings which illustrate the preferred embodiments of the invention. In the following descriptions, the n-type layer or the n-type region is a layer or a region, in which electrons are majority carriers. The p-type layer or the p-type region is a layer or a region, in which holes are majority carriers. Throughout the descriptions of the embodiments and the attached drawings, the same constituent elements are designated by the same reference numerals and the duplicated explanations thereof are omitted for the sake of simplicity.

First Embodiment

Figure 14:
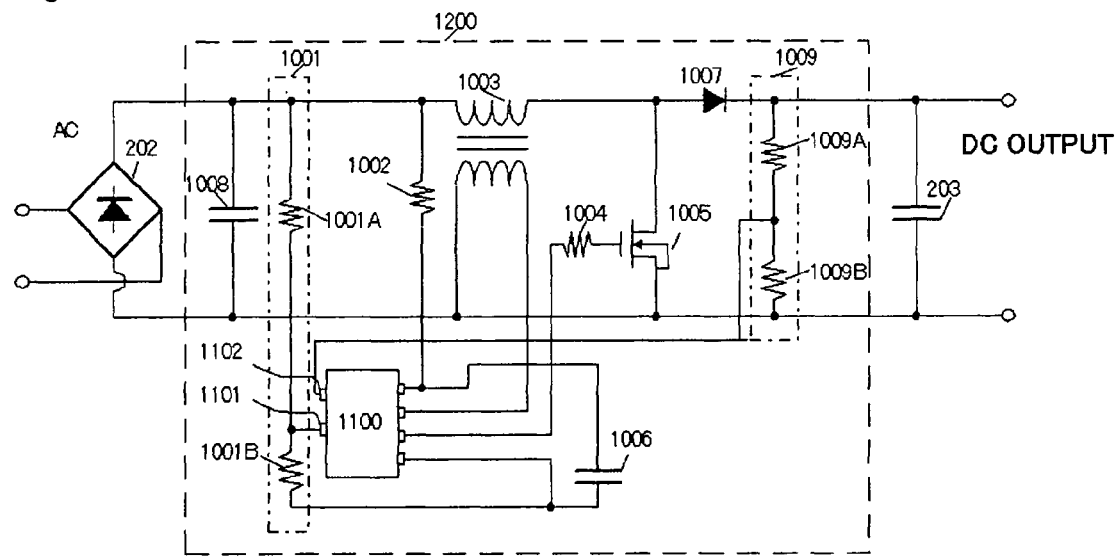
FIG. 14 is a block circuit diagram of a conventional power-factor-improving circuit.
Figure 15:
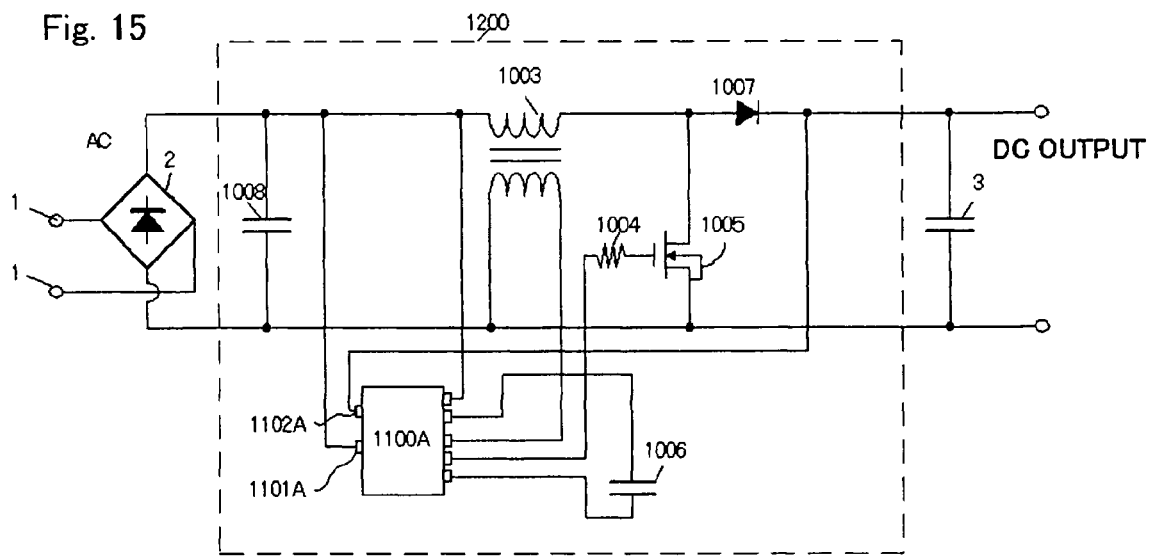
FIG. 15 is a block circuit diagram of a switching power supply according to a first embodiment of the invention.

FIG. 15 is a block circuit diagram of a switching power supply according to a first embodiment of the invention. As shown in FIG. 15, the switching power supply according to the first embodiment includes a power-factor-improving IC 1100A that incorporates therein resistors 1001, 1002 and 1009 shown in FIG. 14. Alternatively, the power-factor-improving IC 1100A may incorporate therein any one of resistors 1001, 1002 and 1009. In order to incorporate the resistor 1002 in the power-factor-improving IC 1100A, it is necessary to additionally provide input terminal 1003B that receives the output from capacitor 1006, to connect input terminal 1103B to the low-voltage-side of resistor 1002, and to connect the high-voltage-side of resistor 1002 to terminal 1103A.

Figure 16:
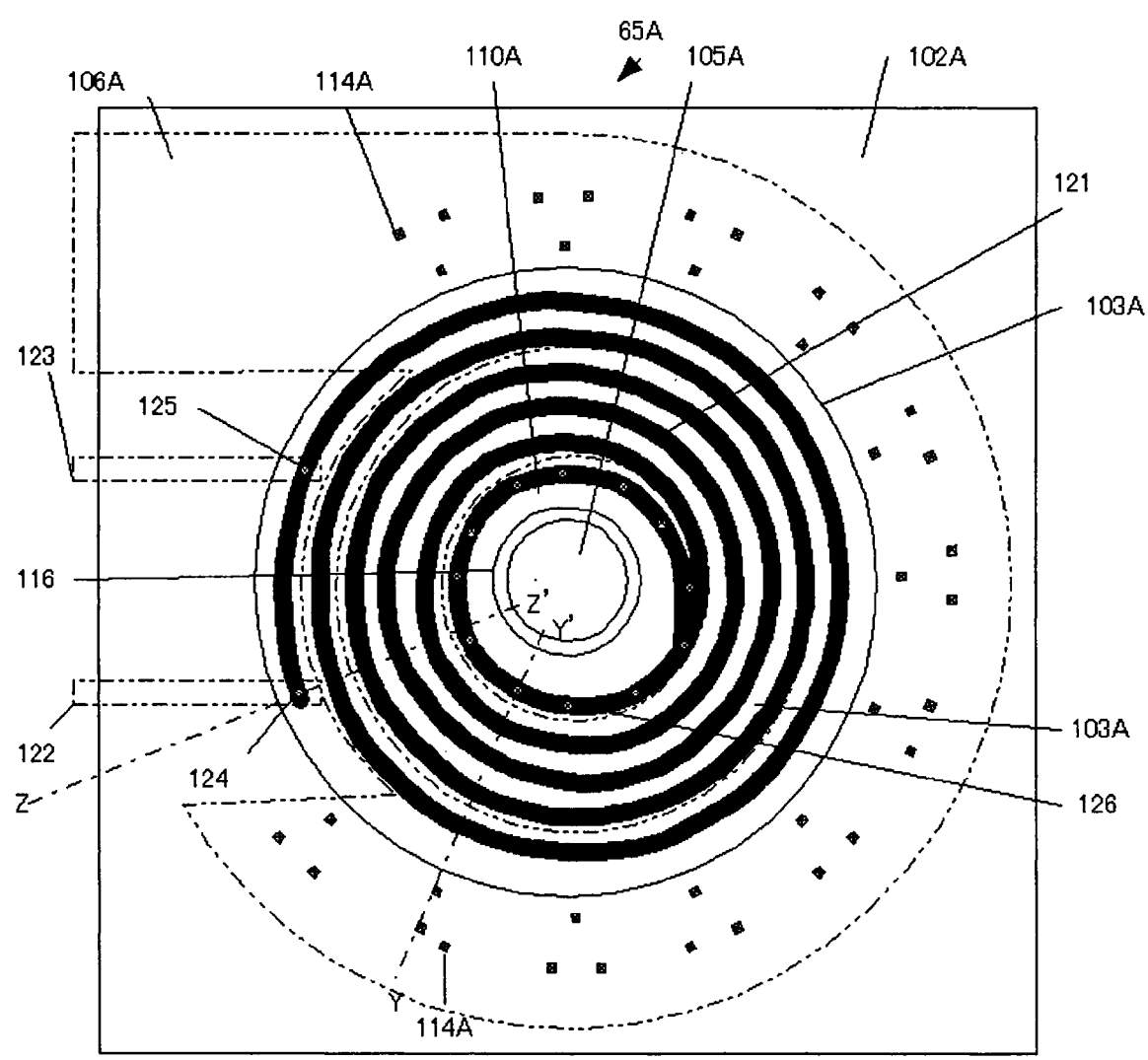
FIG. 16 is a top plan view of a semiconductor device according to the first embodiment.
Figure 17:
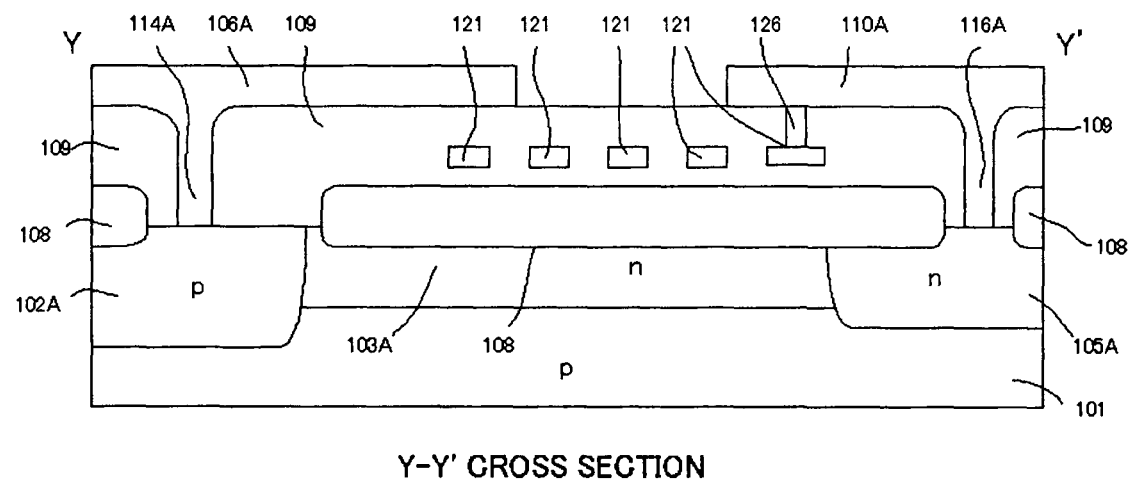
FIG. 17 is a cross sectional view along the line segment Y-Y' of FIG. 16.
Figure 18:
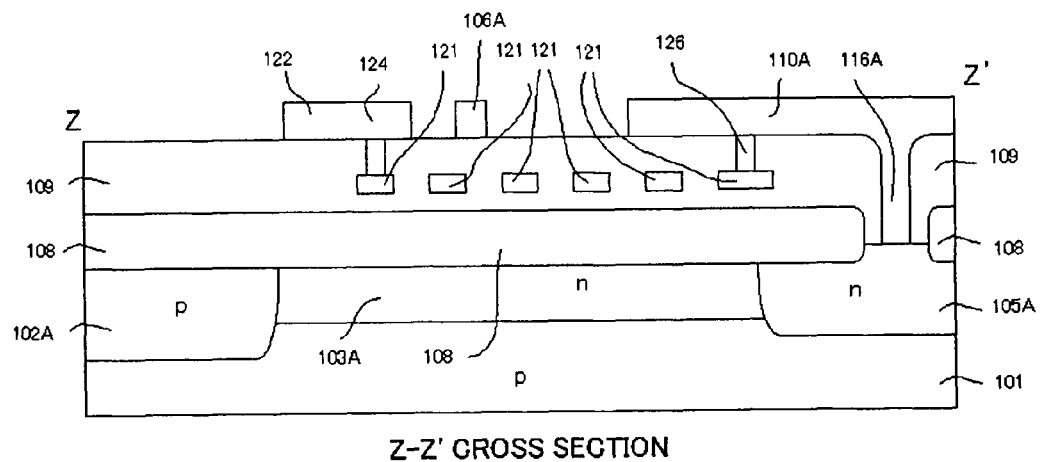
FIG. 18 is a cross sectional view along the line segment Z-Z' of FIG. 16.

FIG. 16 is a top plan view of a semiconductor device according to the first embodiment. FIG. 17 is a cross sectional view along the line segment Y-Y' of FIG. 16. FIG. 18 is a cross sectional view along the line segment Z-Z' of FIG. 16. For clearly showing the characteristic feature of the semiconductor device, the metal wirings, interlayer insulator film and LOCOS oxide film are omitted from FIG. 16. Semiconductor device 65A is used as the very resistive element.

As shown in FIGS. 16 through 18, p-type well region 102A is formed selectively in the surface portion of p-type substrate 101. A lightly doped n-type well region, which will work as depletion region 103A, is formed selectively in the surface portion of p-type substrate 101 such that depletion region 103A is extending circularly into a part of p-type substrate 101. In the central part of depletion region 103A, n-type well region 105A is formed in the surface portion of p-type substrate 101 such that n-type well region 105A is in contact with depletion region 103A.

Interlayer insulator film 109 is disposed on LOCOS oxide film 108 of around 6000 Å in thickness, p-type well region 102A and n-type well region 105A. Very resistive element 121 exhibiting a high breakdown voltage and high electrical resistance is buried in interlayer insulator film 109. The thickness of interlayer insulator film 109 is set at 2000 Å between very resistive element 121 and LOCOS oxide film 108. Very resistive element 121 is made of a polysilicon film, a CrSi film and such a thin resistive film and shaped with a flat spiral. On interlayer insulator film 109, a metal wiring working as wiring 106A, a metal wiring working as wiring 110A, a metal wiring working as first resistance connection wiring 122, and a metal wiring working as second resistance connection wiring 123 are formed.

Wiring 106A is formed above p-type well region 102A such that wiring 106A surrounds n-type well region 105A and depletion region 103A. Wiring 106A is connected electrically to p-type well region 102A via contact 114A formed through interlayer insulator film 109. Wiring 106A is always grounded and is formed such that it sticks out over very resistive element 121. With this configuration, wiring 106A alleviates the intensity of the electrical field that generates on the boundary between n-type depletion region 103A and p-type well region 102A, which improves the pressure-resistant property of semiconductor device 65A.

Wiring 110A is connected electrically to n-type well region 105A via contact 116A formed through interlayer insulator film 109. Wiring 110A is connected to high-voltage input terminal 1101A of the semiconductor integrated circuit 1100A shown in FIG. 15.

The outer termination of very resistive element 121 is connected electrically to first resistance connection wiring 122 via first contact 124 exhibiting a high breakdown voltage and high electrical resistance (hereinafter referred to simply as "first high-resistance contact 124") formed in interlayer insulator film 109. The section of very resistive element 121 before the outer termination thereof is connected electrically to second resistance connection wiring 123 via second contact 125 exhibiting a high breakdown voltage and high electrical resistance (hereinafter referred to simply as "second high-resistance contact 125") formed in interlayer insulator film 109. The innermost circle of very resistive element 121 is connected electrically to wiring 110A via third contact 126 exhibiting a high breakdown voltage and high electrical resistance (hereinafter referred to simply as "third high-resistance contact 126") formed in interlayer insulator film 109.

First resistance connection wiring 122 is always grounded. Second resistance connection wiring 123 is used to control switching device 1005. Therefore, the section of very resistive element 121 between third high-resistance contact 126 and second high-resistance contact 125 corresponds to resistor 1001A, resistor 1002 or resistor 1009A on the side connected to input terminal 1101A. The section of very resistive element 121 between second high-resistance contact 125 and first high-resistance contact 124 corresponds to resistor 1001B or 1009B on the side connected to the ground.

According to the first embodiment, the section of very resistive element 121 corresponding to resistor 1001A, resistor 1002 or resistor 1009A and the section of very resistive element 121 corresponding to resistor 1001B or 1009B are arranged in semiconductor device 65A. Alternatively, any one of resistors 1001A, 1002 and 1009A may be formed in semiconductor device 65A and any one of resistors 1001B and 1009B outside semiconductor device 65A. When a voltage of 500 V is applied to input terminal 1101A, it is necessary for resistor 1001A or 1009A to exhibit a breakdown voltage of 500 V, since resistor 1001A or 1009A is connected directly to input terminal 1101A. However, a voltage of around 5 V is applied to resistor 1001A or 1009A. Therefore, resistor 1001A or 1009A may be formed through the usual process for forming a thin film resistor on an interlayer insulator film of several hundreds Å in thickness formed on a semiconductor substrate.

If one wants to form a very resistive element exhibiting a breakdown voltage of 500 V not on semiconductor device 65A but on a LOCOS oxide film formed on a semiconductor substrate, it will be necessary for the LOCOS oxide film to be as thick as 1.7 μm assuming that the strength of the electric field applied to the LOCOS oxide film is 3 MV/cm. It takes a long time to form such a thick LOCOS oxide film. It is difficult to form the shallow contacts, which reach the very resistive element, simultaneously with forming contacts 116A and 114A, which reach the semiconductor substrate, in the interlayer insulator film formed on the very resistive element. However, if contacts 116A, 114A and the shallow contacts are formed separately, the number of steps will increase.

In semiconductor device 65A having the structure described above, p-type well region 102A is biased at the ground potential and a high voltage is applied to n-type well region 105A. In semiconductor device 65A, a depletion layer is expanded from the junction between p-type well region 102A and depletion region 103A into depletion region 103A to sustain the breakdown voltage. The main reason the depletion layer expands in n-type depletion region 103A is that it is configured such that the impurity concentration in p-type well region 102A is higher than that in n-type depletion region 103A. By raising the impurity concentration in p-type well region 102A and suppressing the depletion layer from expanding in p-type well region 102A, makes it possible to reduce the area of semiconductor device 65A. Semiconductor device 65A according to the first embodiment is designed to sustain a breakdown voltage of, for example, 500 V with the junction between p-type well region 102A and n-type depletion region 103A.

Figure 19:
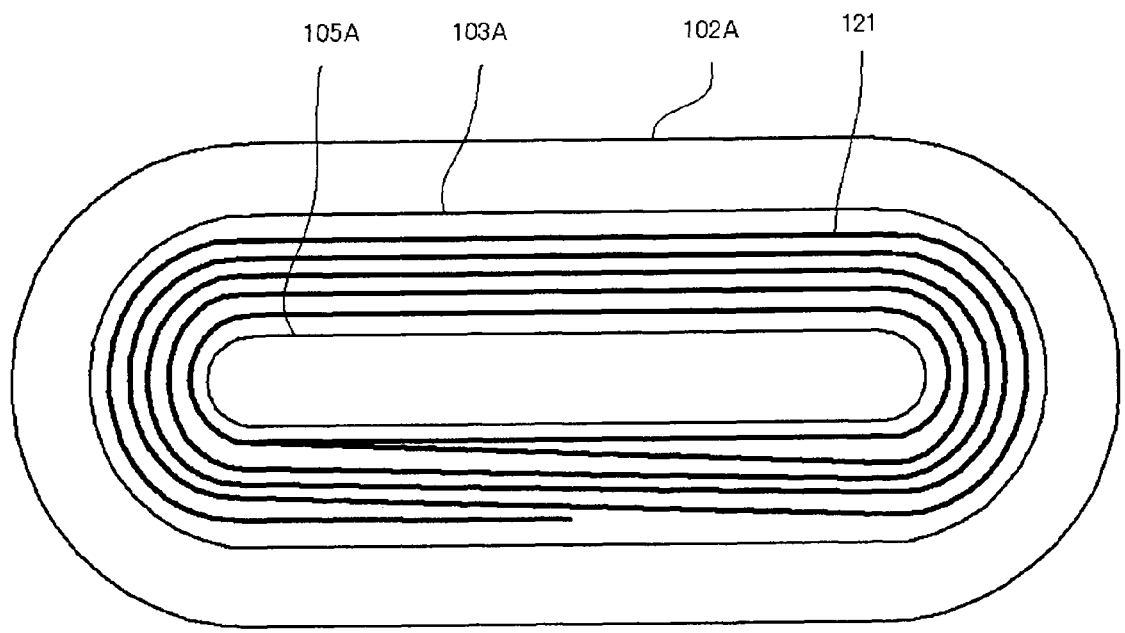
FIG. 19 is another top plan view of a semiconductor device according to the first embodiment.

In the above descriptions, the semiconductor device is shaped almost with a circle in the two-dimensional shape thereof. Alternatively, the semiconductor device may be shaped with an athletic field in the two-dimensional shape thereof with no problem. FIG. 19 is a top plan view of a semiconductor device according to the first embodiment shaped with an athletic field in the two-dimensional shape thereof. For the sake of easy understanding, only p-type well region 102A, n-type depletion region 103A, in-type well region 105A and very resistive element 121 are shown in FIG. 19. When n-type well region 105A is not formed, the contact area of n-type depletion region 103A and contact 116A may be shaped with drain-type well region 105A in the two-dimensional shape thereof with no problem in the same manner as shown in FIG. 19.

Figure 20:
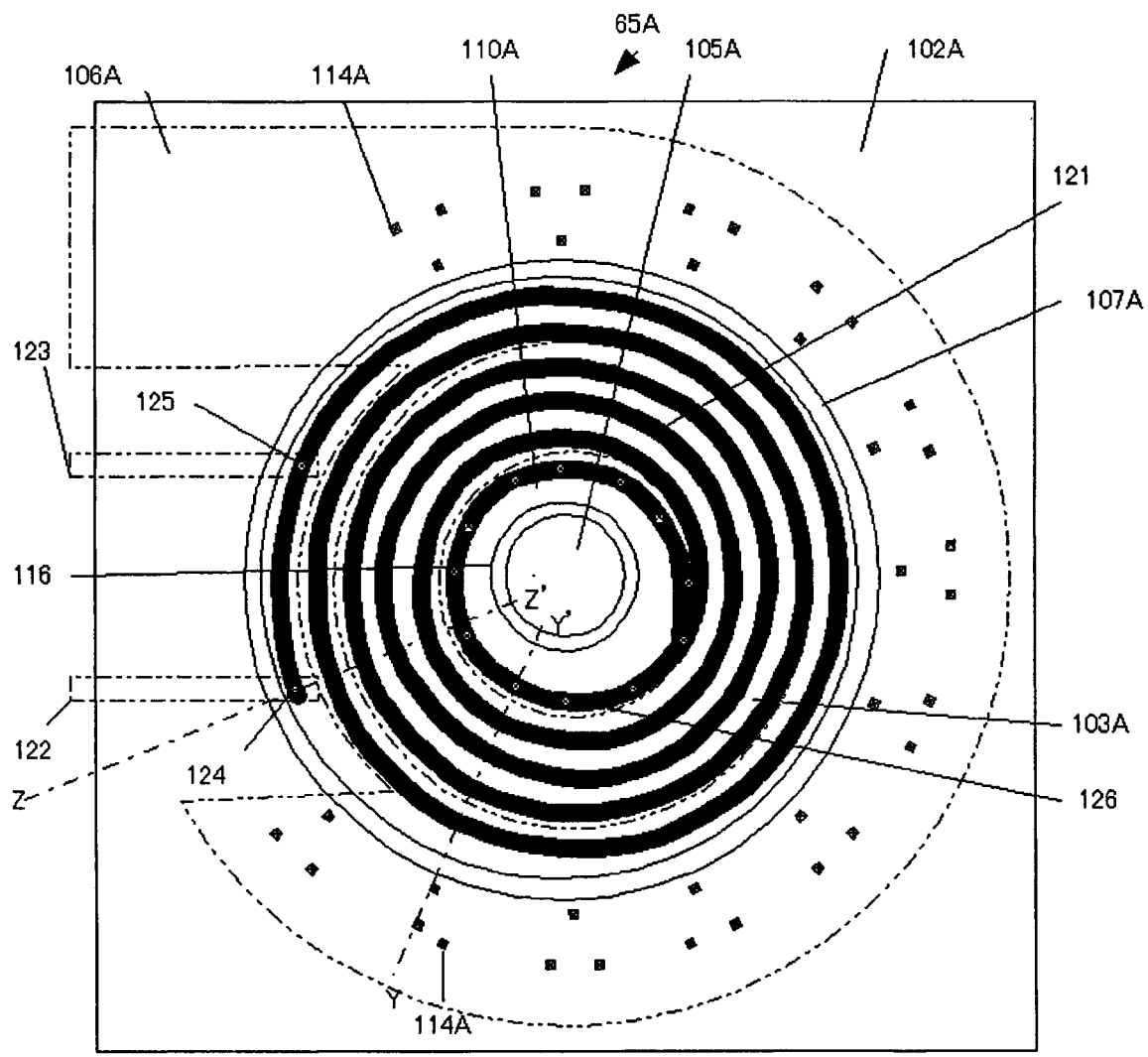
FIG. 20 is a top plan view of another semiconductor device according to the first embodiment.
Figure 21:
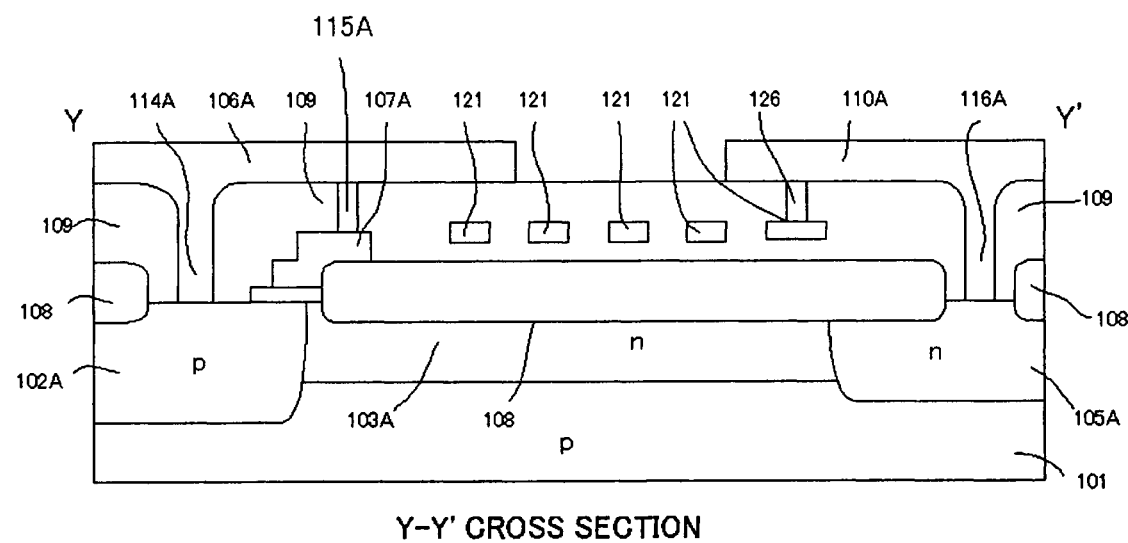
FIG. 21 is a cross sectional view along the line segment Y-Y' of FIG. 20.
Figure 22:
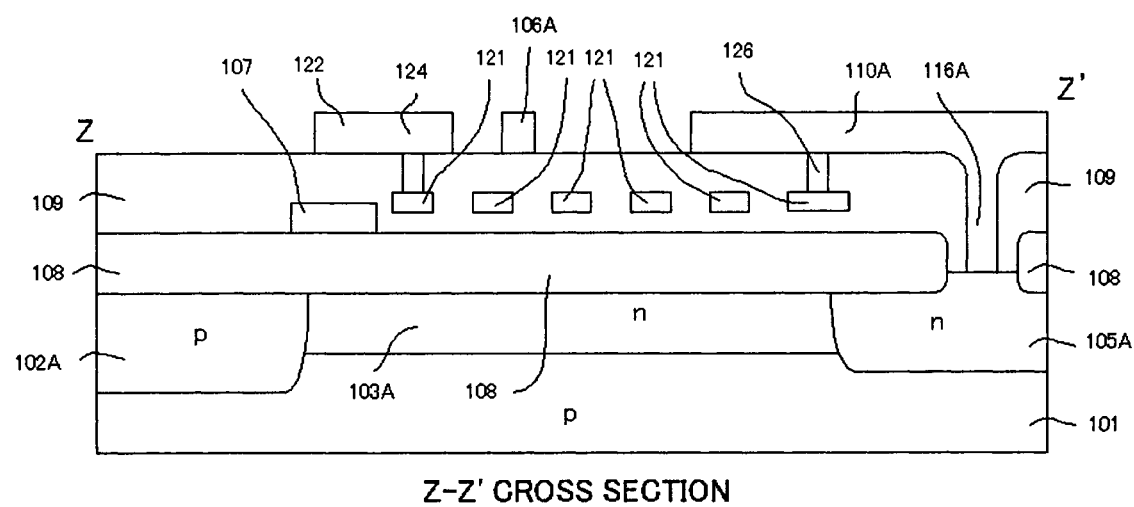
FIG. 22 is a cross sectional view along the line segment Z-Z' of FIG. 20
Figure 23:
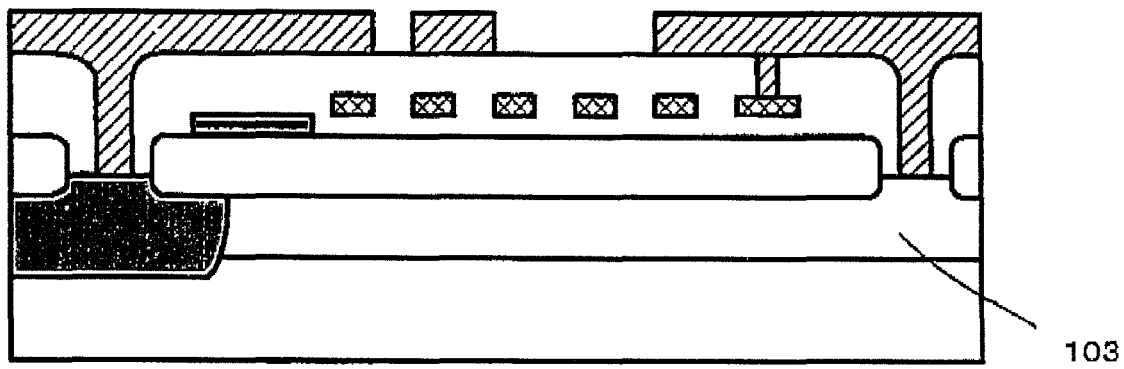
FIG. 23 is a cross-sectional view corresponding to FIG. 4, but showing an arrangement in which the drift region is connected to the drain electrode wiring.
Figure 24:
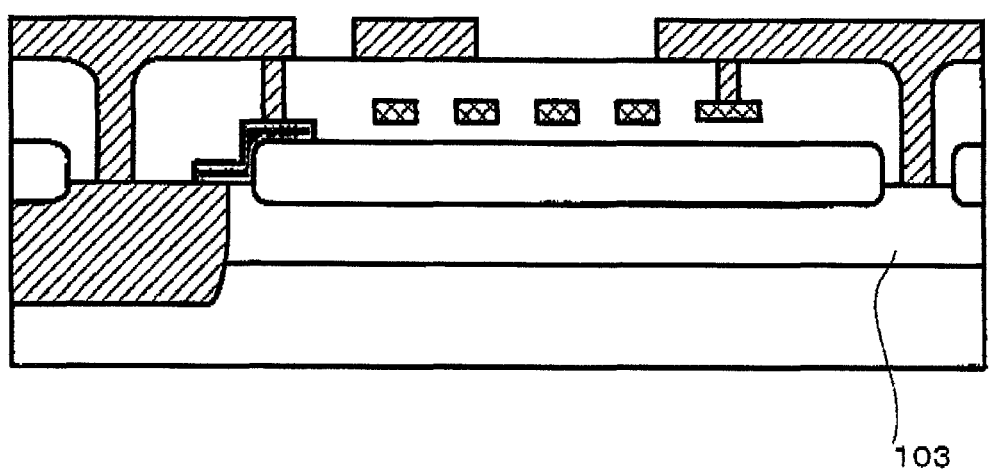
FIG. 24 is a cross-sectional view corresponding to FIG. 5, but showing an arrangement in which the drift region is connected to the drain electrode wiring.

FIG. 20 is a top plan view of another semiconductor device according to the first embodiment. FIG. 21 is a cross sectional view along the line segment Y-Y' of FIG. 20, and FIG. 22 is a cross sectional view along the line segment Z-Z' of FIG. 20. For clearly showing the characteristic feature of the semiconductor device, the metal wirings, interlayer insulator film and LOCOS oxide film are omitted from FIG. 20.

The configuration of the semiconductor device shown in FIGS. 20, 21 and 22 differ from that shown in FIGS. 16, 17 and 18 in that field plate 107A which covers an edge portion of n-type depletion region 103A is formed on LOCOS oxide film 108. Other configurations are the same as FIGS. 16, 17 and 18.

Field plate 107A is connected to wiring 106A via contact 115A so that it is grounded. By adding field plate 107A, it is possible to further alleviate the intensity of the electrical field that generates on the boundary between n-type depletion region 103A and p-type well region 102A, and thus can improve the pressure-resistant property of semiconductor device 65A. Further, under the same pressure, the depletion layer can be suppressed from expanding in n-type depletion region 103A by raising the impurity concentration in n-type depletion region 103A, so that the width of n-type depletion region 103A can be decreased. This makes it possible to reduce the area of semiconductor device 65A.

Second Embodiment

FIG. 1 is a block circuit diagram of a switching power supply according to a second embodiment of the invention.

As shown in FIG. 1, the switching power supply according to the second embodiment includes a resistor (not shown) for detecting the lowering of an AC input voltage (hereinafter referred to as a "resistor") incorporated in starter circuit 41 of control IC 31.

Control IC 31 includes VH terminal (input terminal exhibiting a high breakdown voltage) 32 exhibiting a breakdown voltage of, for example, around 500 V; feedback input terminal (hereinafter referred to as "FB terminal") 33; current sensing input terminal (hereinafter referred to as "IS terminal") 34; power supply voltage terminal (hereinafter referred to as "VCC terminal") 35; gate driver terminal (hereinafter referred to as "OUT terminal") 36 for driving the gate of MOSFET 19; and ground terminal (hereinafter referred to as "GND terminal") 37. VH terminal 32 is a terminal for feeding a current to VCC terminal 35 at the start of the power supply. According to the second embodiment, the voltage obtained by rectifying and smoothing the AC input voltage is applied to VH terminal 32. GND terminal 37 is grounded.

The AC input is fed to rectifier 2 via AC input terminal 1. Rectifier 2 is connected to AC input terminal 1. Rectifier 2 conducts full-wave rectification of the AC input. Power supply capacitor 3 is connected in parallel to the output terminal of rectifier 2 and charged with the DC voltage outputted from rectifier 2. Power supply capacitor 3 charged up works as a DC power supply that feeds a DC voltage to primary coil 6 of transformer 5. VH terminal 32 of control IC 31 is connected to power supply capacitor 3.

Primary coil 6 is connected between power supply capacitor 3 and the drain terminal of MOSFET 19 working as a switching device. The source terminal of MOSFET 19 is connected to IS terminal 34 of control IC 31 and the first end of resistor 20. The second end of resistor 20 is grounded. Resistor 20 converts the current flowing through MOSFET 19 to a voltage and the voltage is applied to IS terminal 34. The gate terminal of MOSFET 19 is connected to OUT terminal 36 of control IC 31.

The first end of auxiliary coil 7 in transformer 5 is connected in parallel to the anode terminal of rectifier diode 17. The second end of auxiliary coil 7 is grounded. A current induced by the switching operation of MOSFET 19 flows through auxiliary coil 7. Rectifier diode 17 rectifies the current flowing through auxiliary coil 7 and charges smoothing capacitor 18 connected to the cathode terminal of rectifier diode 17. Smoothing capacitor 18 is connected to VCC terminal 35 of control IC 31. Smoothing capacitor 18 works as a DC power supply for continuing the switching operation of MOSFET 19.

A voltage is induced across secondary coil 8 of transformer 5 based on the voltage of power supply capacitor 3 by the switching operation of MOSFET 19. The first end of secondary coil 8 is connected to the anode terminal of rectifier diode 9. The cathode terminal of rectifier diode 9 and the second end of secondary coil 8 are connected to DC output terminal 12. smoothing capacitor 10 is connected between the cathode terminal of rectifier diode 9 and the second end of secondary coil 8. Rectifier diode 9 rectifies the current flowing through secondary coil 8 and charges smoothing capacitor 10. Capacitor 10 charged up feeds a DC output controlled at a desired DC voltage value to a load connected to DC output terminal 12.

A series resistance circuit consisting of two resistors 15 and 16 and the first end of resistor 11 are connected to the connection node of the anode terminal of rectifier diode 9 and DC output terminal 12. The second end of resistor 11 is connected to the anode terminal of a photodiode 13 constituting a photocoupler. The cathode terminal of the photodiode 13 is connected to the cathode terminal of a shunt regulator 14. The anode terminal of the shunt regulator 14 is grounded. The resistors 11, 15, 16, photodiode 13, and shunt regulator 14 constitute a voltage detecting and feedback circuit that detects the DC output voltage across smoothing the capacitor 10 and regulates the DC output voltage across the smoothing capacitor 10.

The photodiode 13 outputs an optical signal to regulate the DC output voltage across the smoothing capacitor 10 at a predetermined DC voltage value based on the set value set in the shunt regulator 14. The optical signal is received by a phototransistor 22 constituting the photocoupler together with the photodiode 13. The optical signal received by the photodiode 13 works as a feedback signal to control the IC 31. Phototransistor 22 is connected to FB terminal 33 of control IC 31. The feedback signal is inputted to FB terminal 33. Capacitor 21 is connected to phototransistor 22. Capacitor 21 works as a noise-cut filter for the feedback signal.

Control IC 31 includes a starter circuit 41, under-voltage-lock-out circuit (hereinafter referred to as "UVLO circuit") 42, regulator 43, BO comparator 44, oscillator 45, driver circuit 46, output amplifier 47, pulse-width-modulation comparator (hereinafter referred to as "PWM comparator") 48, latch circuit 49, and reference power supply 50. Starter circuit 41 is connected to VH terminal 32, VCC terminal 35 and the non-inverting input terminal of BO comparator 44. Starter circuit 41 feeds a current to VCC terminal 35 at the start of the power supply.

UVLO circuit 42 is connected to VCC terminal 35 and starter circuit 41. As the voltage of VCC terminal 35 rises to be high enough to make control IC 31 work by the current fed from starter circuit 41, UVLO circuit 42 interrupts the current feed from starter circuit 41 to VCC terminal 35. After the current interruption, a current is fed to VCC terminal 35 from auxiliary coil 7. Regulator 43 is connected to VCC terminal 35. Regulator 43 generates a reference voltage necessary for the operations of the constituent elements in control IC 31 based on the voltage of VCC terminal 35. After the start of the power supply, control IC 31 is driven by the reference voltage fed from regulator 43.

The inverting input terminal of PWM comparator 48 is connected to IS terminal 34 and the non-inverting input terminal of PWM comparator 48 to FB terminal 33. PWM comparator 48 inverts the output thereof depending on the voltages at the inverting and non-inverting input terminals thereof. The output from PWM comparator 48 is inputted to driver circuit 46.

Oscillator 45 is connected to driver circuit 46. The oscillation signal from oscillator 45 is inputted to driver circuit 46. As a turn-on signal is inputted from oscillator 45 to driver circuit 46 and the voltage at the non-inverting input terminal of PWM comparator 48 (i.e. the voltage of FB terminal 33) is higher than the voltage at the inverting input terminal of PWM comparator 48 (i.e. the voltage of IS terminal 34), the output signal from driver circuit 46 is set to be high (at a Hi-state). Output amplifier 47 amplifies the output from driver circuit 46 set at the Hi-state thereof and drives the gate of MOSFET 19 via OUT terminal 36.

As the voltage at the inverting input terminal of PWM comparator 48 becomes higher than the voltage at the non-inverting input terminal thereof, the output from PWM comparator 48 is inverted and the output signal from driver circuit 46 is set at the Low-state thereof. Output amplifier 47 amplifies the output signal from driver circuit 46 set at the Low-state and feeds the amplified signal to the gate of MOSFET 19 via OUT terminal 36. Since MOSFET 19 is brought into the OFF-state thereof, any current does not flow through MOSFET 19. By controlling the ON-period of MOSFET 19 variably by means of changing the threshold level of PWM comparator 48 in response to the secondary-side output voltage as described above, the secondary-side output voltage is stabilized.

The inverting input terminal of BO comparator 44 is connected to reference power supply 50. BO comparator 44 inverts the output thereof depending on the voltages at the inverting and non-inverting input terminals thereof. Since a voltage signal divided to be low by the resistors in starter circuit 41 is inputted to BO comparator 44 as described later, BO comparator 44 may be formed of a MOS device, the breakdown voltage thereof is low. The output from BO comparator 44 is inputted to driver circuit 46.

When the voltage at the non-inverting input terminal of BO comparator 44 is higher than voltage at the inverting input terminal thereof in the state, in which driver circuit 46 is outputting a signal set at the Hi-state, the signal from driver circuit 46 keeps the Hi-state thereof. As the voltage feed from the AC input is removed and the primary-side input voltage lowers, the voltage at the non-inverting input terminal of BO comparator 44 becomes lower than the voltage at the inverting input terminal thereof. As the voltage at the non-inverting input terminal of BO comparator 44 becomes lower than the voltage at the inverting input terminal thereof, the output signal from driver circuit 46 is inverted to be in the Low-state and the switching operation of MOSFET 19 is stopped. Thus, the brownout function works.

Latch circuit 49 is connected to driver circuit 46. When an anomaly such as rise of secondary-side output voltage, heat generation in control IC 31 and lowering of secondary-side output voltage is detected, latch circuit 49 forcibly sets the output from driver circuit 46 at the Low-state for over-voltage protection, for overheat protection or for overcurrent protection and stops the power feed to the secondary-side output. This state is maintained until the VCC power supply voltage is lowered and control IC 31 is reset. The devices constituting the circuits in control IC 31 are formed, for example, on the same semiconductor substrate, although not limited thereto.

Figure 2:
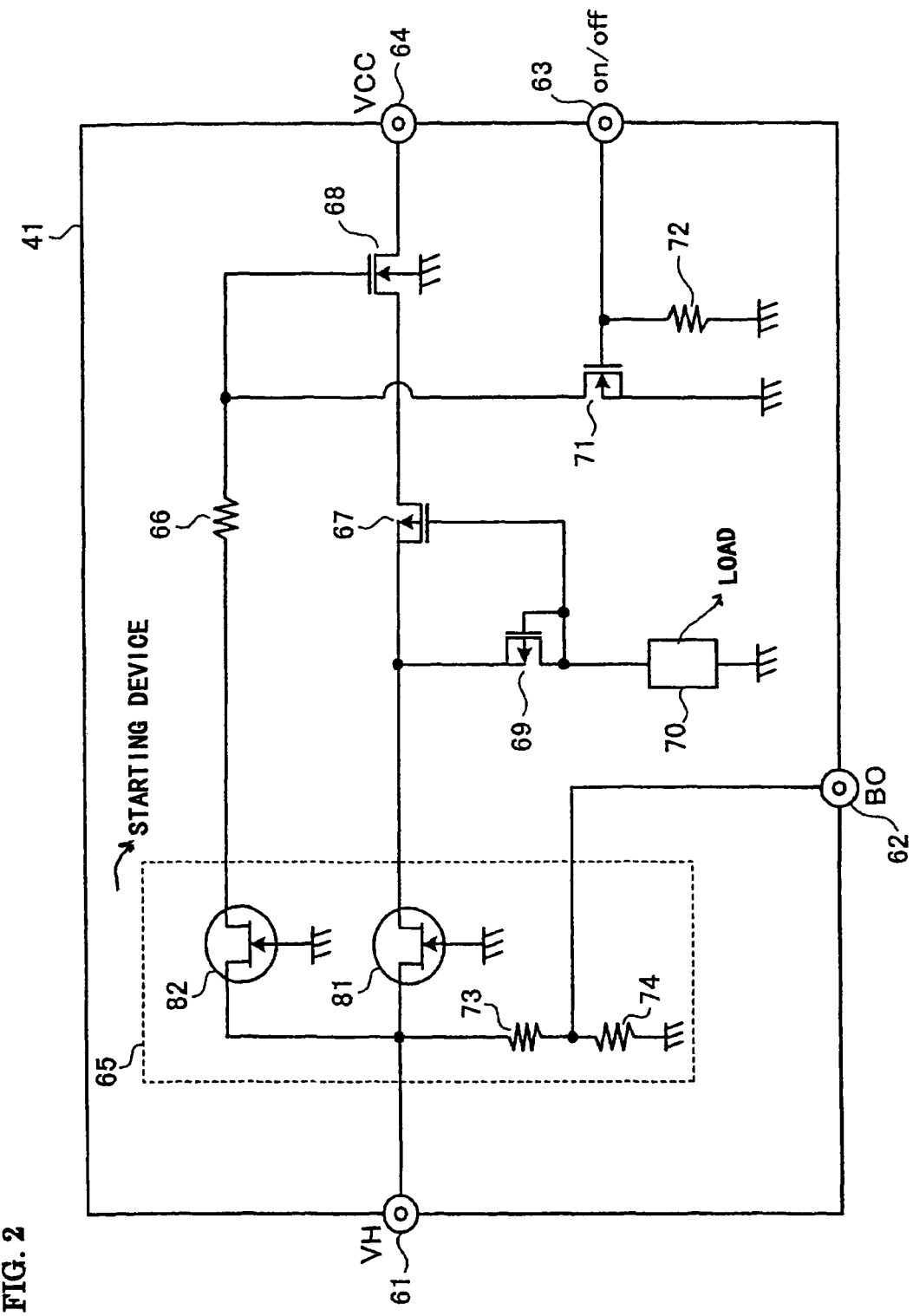
FIG. 2 is a circuit diagram of a starter circuit according to the second embodiment.

FIG. 2 is a circuit diagram of the starter circuit. As shown in FIG. 2, starter circuit 41 includes input terminal exhibiting a high breakdown voltage (hereinafter referred to as "VH terminal") 61, brownout input terminal (hereinafter referred to as "BO terminal") 62, on/off signal input terminal (hereinafter referred to as "on/off terminal") 63, and power supply voltage terminal (hereinafter referred to as "VCC terminal") 64. VH terminal 61 is connected to VH terminal 32 of control IC 31 and VCC terminal 64 to VCC terminal 35 of control IC 31. The on/off terminal 63 is connected to UVLO circuit 42.

Starter circuit 41 includes starting device 65. Starting device 65 includes two JFETs 81, 82 exhibiting a high breakdown voltage and a series resistance circuit consisting of two resistors 73, 74. BO terminal 62 is connected to the intermediate node of the series resistance circuit consisting of resistors 73 and 74. The series resistance circuit consisting of resistors 73 and 74 is connected to VH terminal 61.

BO terminal 62 is connected to the non-inverting input terminal of BO comparator 44. In other words, the voltage obtained by dividing the input voltage to VH terminal 61 with resistors 73 and 74 is inputted to the non-inverting input terminal of BO comparator 44. The resistance value of resistor 73 or 74 is 1 MΩ or higher, although not limited thereto. Although not specified, the maximum resistance value of resistor 73 or 74 is equal to or lower than the upper limit value of the resistance that can be formed in an IC. The upper limit resistance value of resistor 73 or 74 is, for example, 10 MΩ or lower.

Two JFETs 81 and 82 are field effect junction transistors of a normally-on type. The gate terminals of JFETs 81 and 82 are grounded. The drain terminals of JFETs 81 and 82 are connected commonly to VH terminal 61. The source terminal of first JFET 81 is connected to the source terminal of first PMOS transistor 67 and the source terminal of second PMOS transistor 69.

The gate terminals of first PMOS transistor 67 is connected commonly to the gate and drain terminals of second PMOS transistor 69. The drain terminal of second PMOS transistor 69 is connected to load 70. First NMOS transistor 68 is connected between the drain terminal of first PMOS transistor 67 and VCC terminal 64.

The gate terminal of first NMOS transistor 68 is connected to the source terminal of second JFET 82 via resistor 66. The gate terminal of first NMOS transistor 68 is connected also to the drain terminal of second NMOS transistor 71. The gate terminal of second NMOS transistor 71 is connected to on/off terminal 63. The source terminal of second NMOS transistor 71 is grounded. The gate terminal of second NMOS transistor 71 is also grounded via resistor 72.

In starter circuit 41 configured as described above, the current flowing through second PMOS transistor 69 is determined by the voltage versus current characteristics of second PMOS transistor 69 and the impedance of load 70. Second PMOS transistor 69 and first PMOS transistor 67 are connected to each other in the form of a current mirror connection. While the W/L value of second PMOS transistor 69 is 1, the W/L value of first PMOS transistor 67 is 100. Here, W represents the channel width and L the channel length. Therefore, a current 100 times as high as the current that flows through second PMOS transistor 69 flows through first PMOS transistor 67.

First NMOS transistor 68 functions as a switch, the ON-state and the OFF-state thereof are changed over based on the ON/OFF signal fed from is UVLO circuit 42 via on/off terminal 63. Since second NMOS transistor 71 is brought into the OFF-state thereof and a high voltage is inputted to the gate terminal of first NMOS transistor 68 when the ON/OFF signal is in the Low-state, the switch is brought into the ON-state thereof. As the switch is brought into the ON-state thereof, a current is fed from starter circuit 41 to VCC terminal 35 of control IC 31 at the start of the power supply described above.

Since second NMOF transistor 71 is in the ON-state thereof and the gate voltage of first NMOS transistor 68 is set at zero when ON/OFF signal is in the Hi-state, the switch is brought into the OFF-state thereof. Since the current path between VH terminal 61 and VCC terminal 64 is interrupted, the current feed from starter circuit 41 to VCC terminal 35 is stopped.

In some cases, JFETs 81 and 82 are integrated into one JFET. When only JFET 81 is employed, the wiring to be connected to resistor 66 connected to the source of JFET 82 may be connected to the source of JFET 81, since JFET 82 is unnecessary.

Figure 3:
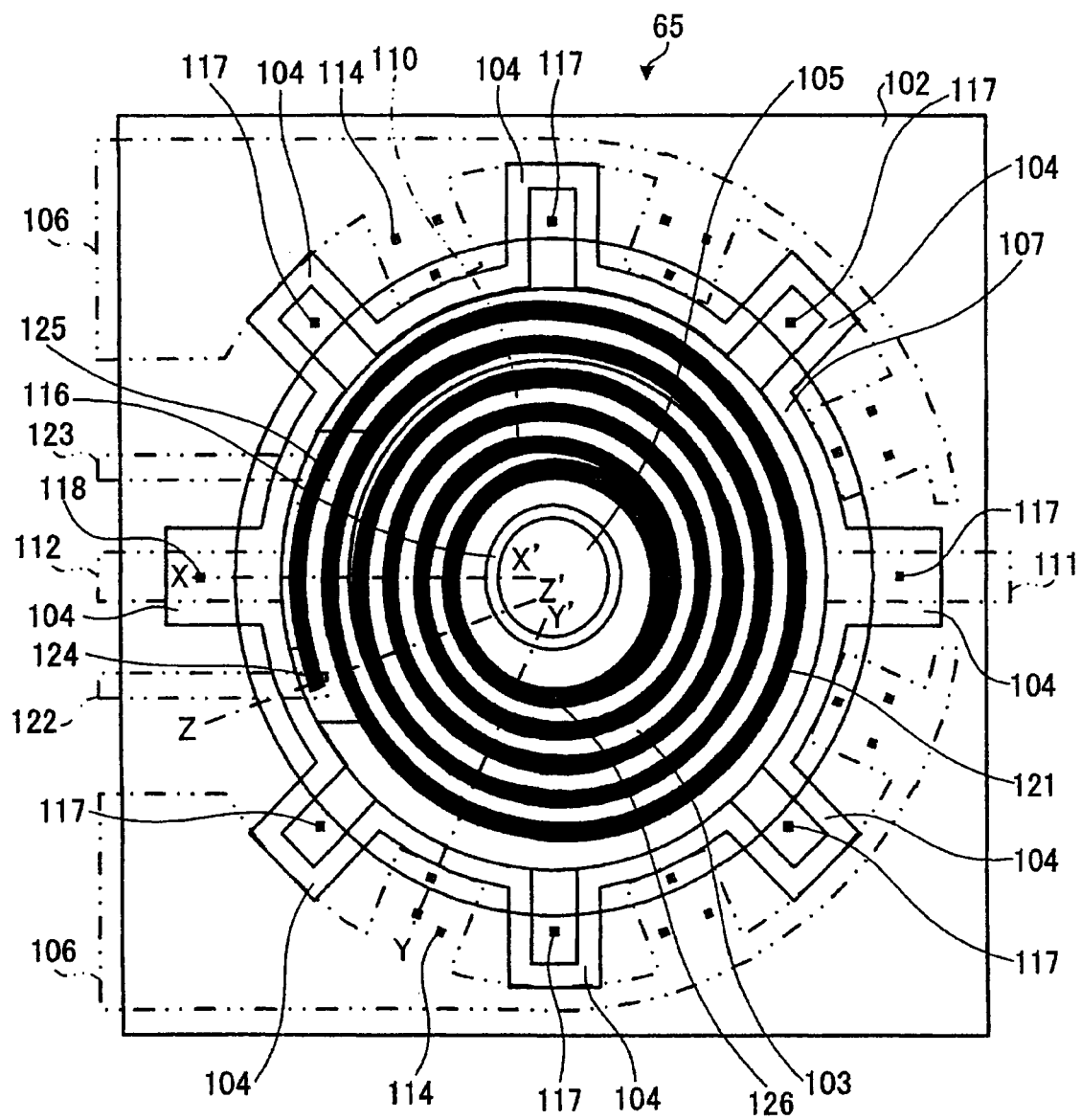
FIG. 3 is a top plan view of a semiconductor device according to the second embodiment.
Figure 4:
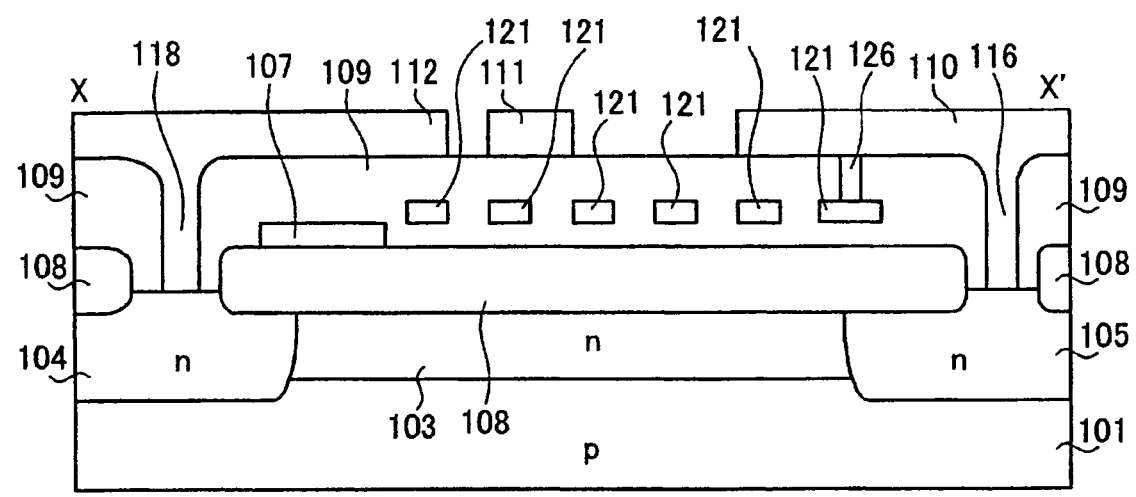
FIG. 4 is a cross sectional view along the line segment X-X' of FIG. 3.
Figure 5:
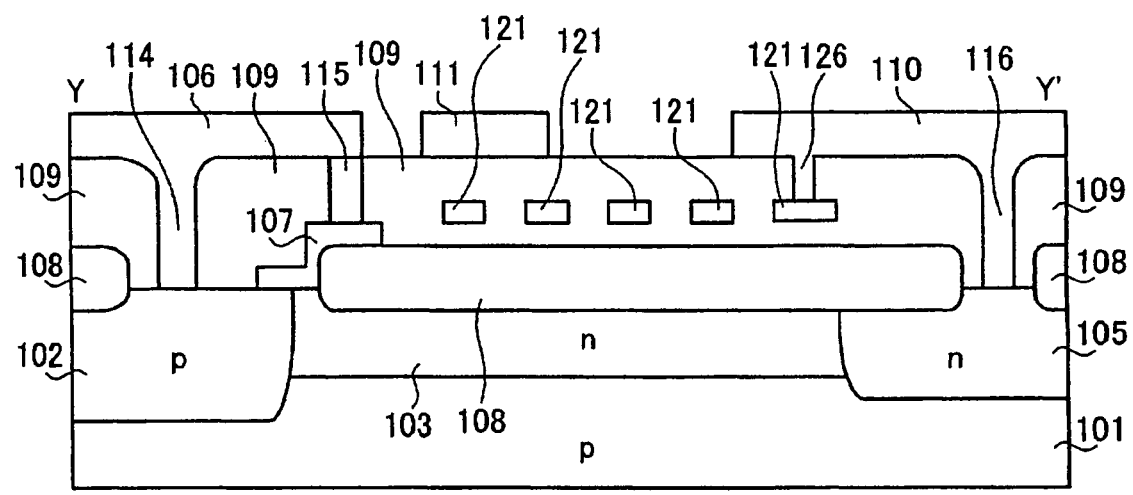
FIG. 5 is a cross sectional view along the line segment Y-Y' of FIG. 3.
Figure 6:
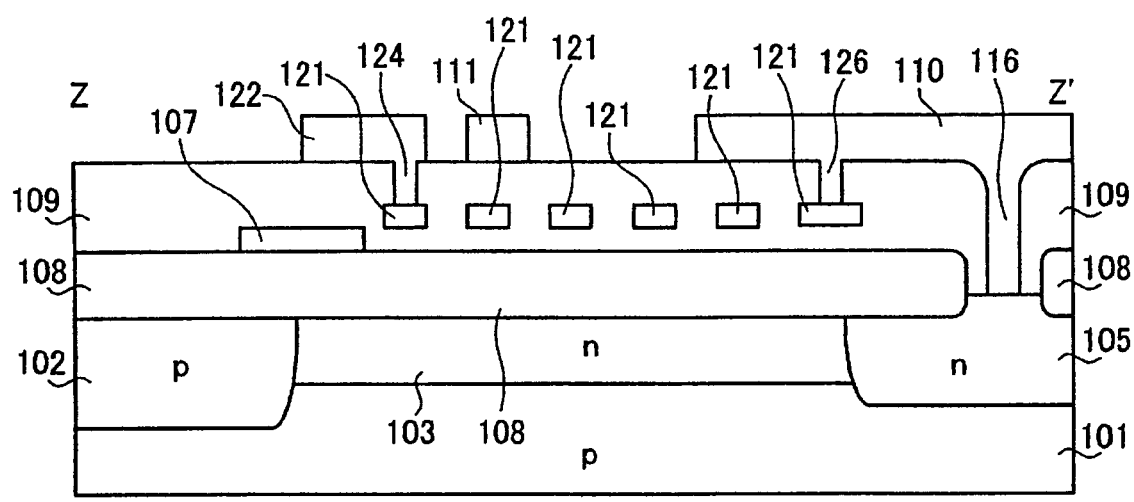
FIG. 6 is a cross sectional view along the line segment Z-Z' of FIG. 3.

FIG. 3 is a top plan view of a semiconductor device according to the second embodiment. FIG. 4 is a cross sectional view along the line segment X-X' of FIG. 3. FIG. 5 is a cross sectional view along the line segment Y-Y' of FIG. 3. FIG. 6 is a cross sectional view along the line segment Z-Z' of FIG. 3. For clearly showing the characteristic feature of the semiconductor device, the metal wirings, interlayer insulator film and LOCOS oxide film are omitted from FIG. 3. The semiconductor device constitutes starting device 65 as described above.

As shown in FIGS. 3 through 6, a p-type well region, which works as gate region 102, is formed selectively in the surface portion of p-type substrate 101. Gate region 102 provides a channel region, in which a channel is formed. A lightly doped n-type well region, which works as drift region 103, is formed selectively in the surface portion of p-type substrate 101 such that drift region 103 is extended into a part of gate region 102 for a certain width. In the surface portions of p-type substrate 101, into which drift region 103 is extended, multiple, e.g. eight, heavily doped n-type well regions, which work as source regions 104, are formed selectively. Source region 104 may be formed in all the eight portions, into which drift region 103 is extended. Alternatively, source region 104 may be formed in some of the eight portions, e.g. seven or less portions, into which drift region 103 is extended.

A heavily doped n-type well region, which works as drain region 105, is formed selectively in the surface portion of p-type substrate 101 such that drain region 105 is facing opposite to and spaced apart from source region 104. Source regions 104 are formed on a circle spaced apart from drain region 105 for a certain spacing. Source regions 104 and drain region 105 are formed simultaneously by diffusion. It is not always necessary to form drain region 105. When drain region 105 is not formed, drift region 103 is connected to drain electrode wiring 110.

On the location, thereat drift region 103 and gate region 102 contact each other, polysilicon gate electrode 107 which works as a control electrode is formed such that polysilicon gate electrode 107 is on gate region 102 and drift region 103. In the location, therein source region 104 is formed, polysilicon gate electrode 107 is formed on LOCOS oxide film 108 of around 6000□ in thickness formed on drift region 103. Interlayer insulator film 109 is disposed on LOCOS oxide film 108, polysilicon gate electrode 107, gate region 102, source regions 104 and drain region 105.

In the regions between drain region 105 and gate region 102 or source regions 104, very resistive element 121 exhibiting a high breakdown voltage and high electrical resistance (hereinafter referred to simply as "very resistive element 121") is buried in interlayer insulator film 109. Interlayer insulator film 109 is set to be 2000 Å in thickness between very resistive element 121 and LOCOS oxide film 108. Very resistive element 121 is made of a polysilicon film, a CrSi film and such a thin resistive film and shaped with a flat spiral. On interlayer insulator film 109, a metal wiring working as gate electrode wiring 106, a metal wiring working as drain electrode wiring 110, a metal wiring working as first source electrode wiring 111, a metal wiring working as second source electrode wiring 112, a metal wiring working as first resistance connection wiring 122, and a metal wiring working as second resistance connection wiring 123 are formed.

Gate electrode wiring 106 is formed above gate region 102 such that gate electrode wiring 106 surrounds drain region 105, drift region 103 and source regions 104. Gate electrode wiring 106 is connected electrically to gate region 102 via gate contact 114 formed through interlayer insulator film 109 and to polysilicon gate electrode 107 via polysilicon contact 115 formed through interlayer insulator film 109. Gate electrode wiring 106 is always grounded.

Drain electrode wiring 110 is connected electrically to drain region 105 via drain contact 116 formed through interlayer insulator film 109. Drain region 105 is a common drain region common to first JFET 81 and second JFET 82. Drain electrode wiring 110 is connected to VH terminal 61 of starter circuit 41.

First source electrode wiring 111 is electrically connected, for example, to seven source regions 104 via source contacts 117 formed through interlayer insulator film 109. Seven source regions 104, to which first source electrode wiring 111 is connected electrically, work as the source regions of first JFET 81. Second source electrode wiring 112 is electrically connected, for example, to another source region 104 via source contact 118 formed through interlayer insulator film 109.

Source region 104, to which second source electrode wiring 112 is connected electrically, works as the source region of second JFET 82. Here, eight source regions 104 are divided into seven source regions 104 for first JFET 81 and one source region 104 for second JFET 82. However, any alternative distribution of source regions 104 to first and second JFETs 81 and 82 is employable as far as an effective starting current is secured. For securing an effective starting current, it is preferable to assign more source regions to first JFET 81 than to second JFET 82. Alternatively, first and second JFETs 81 and 82 may be formed as separate devices. For example, first and second source electrode wirings 111 and 112 are connected to each other so that first JFET 81 and very resistive element 121 may be integrated into a unit and second JFET 82 is formed in the other region in the configuration shown in FIG. 3. When second JFET 82 is not formed as described earlier, first and second source electrode wirings 111 and 112 are connected to each other and first JFET 81 and very resistive element 121 are integrated into a unit.

The outer termination of very resistive element 121 is connected electrically to first resistance connection wiring 122 via first contact 124 exhibiting a high breakdown voltage and high electrical resistance (hereinafter referred to simply as "first high-resistance contact 124") disposed in interlayer insulator film 109. The section of very resistive element 121 before the outer termination thereof is connected electrically to second resistance connection wiring 123 via second contact 125 exhibiting a high breakdown voltage and high electrical resistance (hereinafter referred to simply as "second high-resistance contact 125") disposed in interlayer insulator film 109. The innermost circle of very resistive element 121 is connected electrically to drain electrode wiring 110 via third contact 126 exhibiting a high breakdown voltage and high electrical resistance (hereinafter referred to simply as "third high-resistance contact 126") disposed in interlayer insulator film 109.

First resistance connection wiring 122 is always grounded. Second resistance connection wiring 123 is connected to BO terminal 62. Therefore, the section of very resistive element 121 between third high-resistance contact 126 and second high-resistance contact 125 corresponds to resistor 73 connected to VH terminal 61. The section of very resistive element 121 between second high-resistance contact 125 and first high-resistance contact 124 corresponds to resistor 74 connected to the ground.

According to the second embodiment, resistors 73 and 74 are formed on starting device 65. Alternatively, only resistor 73 formed of very resistive element 121 may be formed on starting device 65 and resistor 74 may be formed on a region outside starting device 65. When a voltage of 500 V is applied to VH terminal 61, it is necessary for resistor 73 to exhibit a breakdown voltage of 500 V, since resistor 73 is connected directly to VH terminal 61. However, a voltage of around 5 V is applied to resistor 74. Therefore, resistor 74 may be formed through the usual process for forming a thin film resistor on an interlayer insulator film of several hundreds □ in thickness formed on a semiconductor substrate.

If one wants to form a very resistive element exhibiting a breakdown voltage of 500 V not on starting device 65 but on a LOCOS oxide film formed on a semiconductor substrate, it will be necessary for the LOCOS oxide film to be as thick as 1.7 µm assuming that the strength of the electric field applied to the LOCOS oxide film is 3 MV/cm. It takes a long time to form such a thick LOCOS oxide film. It is difficult to form contacts 116 and 118 which reach the semiconductor substrate simultaneously with forming the other contacts, which reach the very resistive element, in the interlayer insulator film formed on the very resistive element. However, if contacts 116 and 118 are formed separately from the other contacts, the number of steps will increase. Since it is also necessary to secure another region, in which contacts 116 and 118 are formed, separately from the region, in which the staring device is formed, the chip area is widened.

In starting device 65 having the structure described above, the junction between gate region 102 and drift region 103 provides the structure for sustaining a high breakdown voltage and source regions 104 provide the structure for making a high current flow. Since the structure for sustaining a high breakdown voltage and the structure for making a high current flow are separated, both a high breakdown voltage and low on-resistance are realized in the same device. As a voltage is applied to drain region 105, a drain current flows radially. As source regions 104 are biased at a positive potential and the positive potential rises to a certain value, drift region 103 is cut off by a depletion layer and the drain current is interrupted. The region between the drain and source is designed to sustain a breakdown voltage of, for example, 500 V mainly with the junction between gate region 102 and drift region 103.

Third Embodiment

Figure 7:
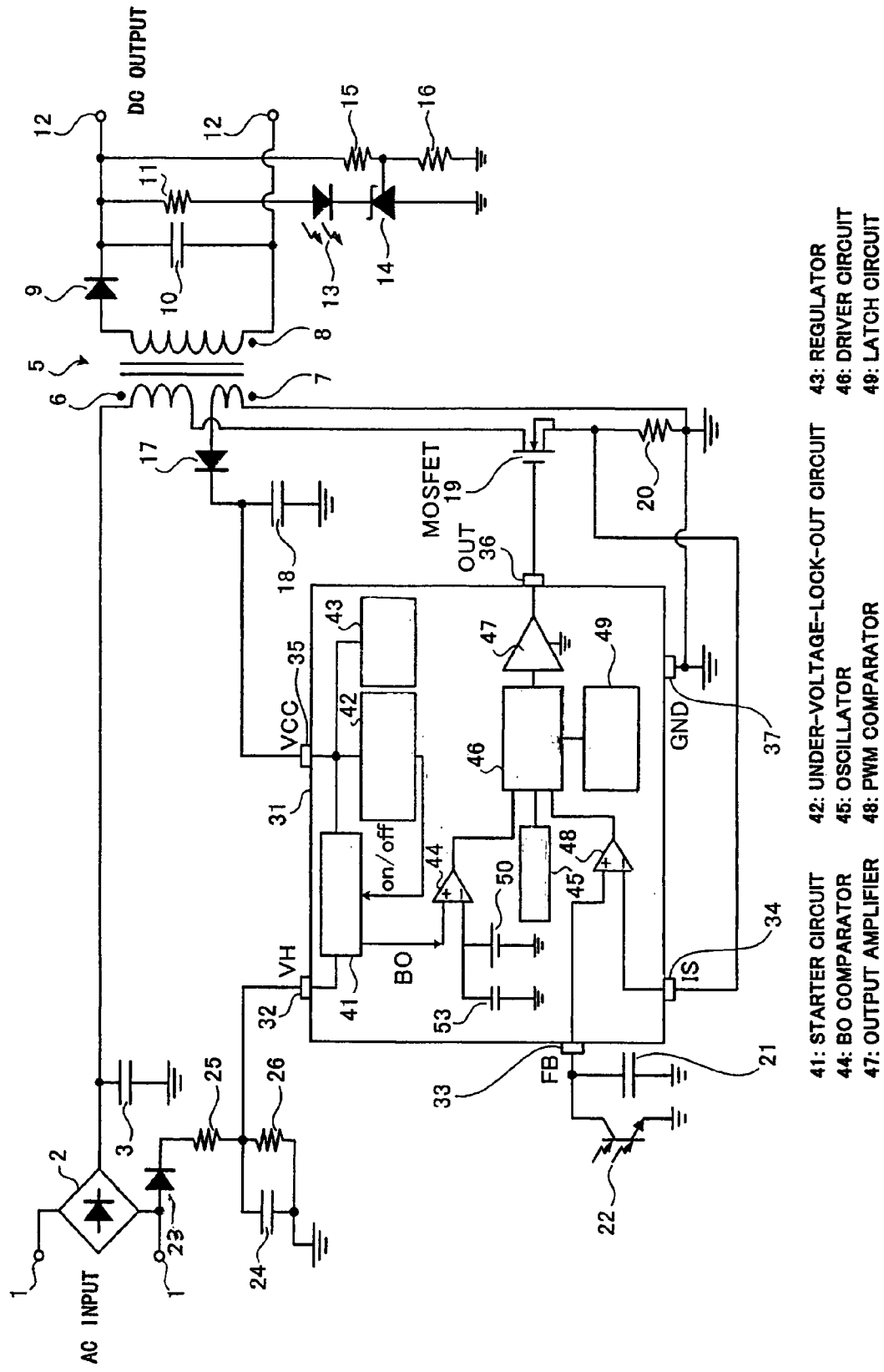
FIG. 7 is a block circuit diagram of a switching power supply according to a third embodiment of the invention.

FIG. 7 is a block circuit diagram of a switching power supply according to a third embodiment of the invention. In the switching power supply according to the third embodiment shown in FIG. 7, the voltage obtained by the half-wave rectification of an AC input voltage is inputted to VH terminal 32 of control IC 31. For setting the voltage of VH terminal 32 not to be zero even when the AC input voltage is zero, a smoothing circuit having a structure as described below is necessary.

The switching power supply according to the third embodiment additionally includes reverse blocking diode 23, capacitor 24, first resistor 25 and second resistor 26 added to the switching power supply according to the second embodiment. Reverse blocking diode 23, capacitor 24, first resistor 25 and second resistor 26 are added externally to control IC 31. According to the third embodiment, the device, to which VH terminal 32 is connected, is different from the device, to which VH terminal 32 is connected in the switching power supply according to the second embodiment. Since the other configurations are the same according to the second and third embodiments, their duplicated descriptions will be omitted for the sake of simplicity. Since the configuration of starter circuit 41 and the configuration of starting device 65 in starter circuit 41 are the same according to the second and third embodiments, their duplicated descriptions will be omitted for the sake of simplicity.

The anode terminal of diode 23 is connected to one of AC input terminals 1. The cathode terminal of diode 23 is connected to the first end of first resistor 25. The second end of first resistor 25 is connected to VH terminal 32 and the first end of second resistor 26. The second end of second resistor 26 is grounded. Capacitor 24 is connected in parallel to second resistor 26. Capacitor 24 prevents the voltage at VH terminal 32 from lowering when any voltage is not fed from the AC input.

Second resistor 26 is a resistor for discharging capacitor 24. Second resistor 26 prevents a high voltage from remaining across capacitor 24 after the voltage feed from the AC input is stopped. First resistor 25 and capacitor 24 constitute a low-pass filter for preventing sharp voltage rise caused by the AC input from occurring. First and second resistors 25 and 26 work as the voltage dividing resistors which adjust the voltage inputted to VH terminal 32.

Figure 8:
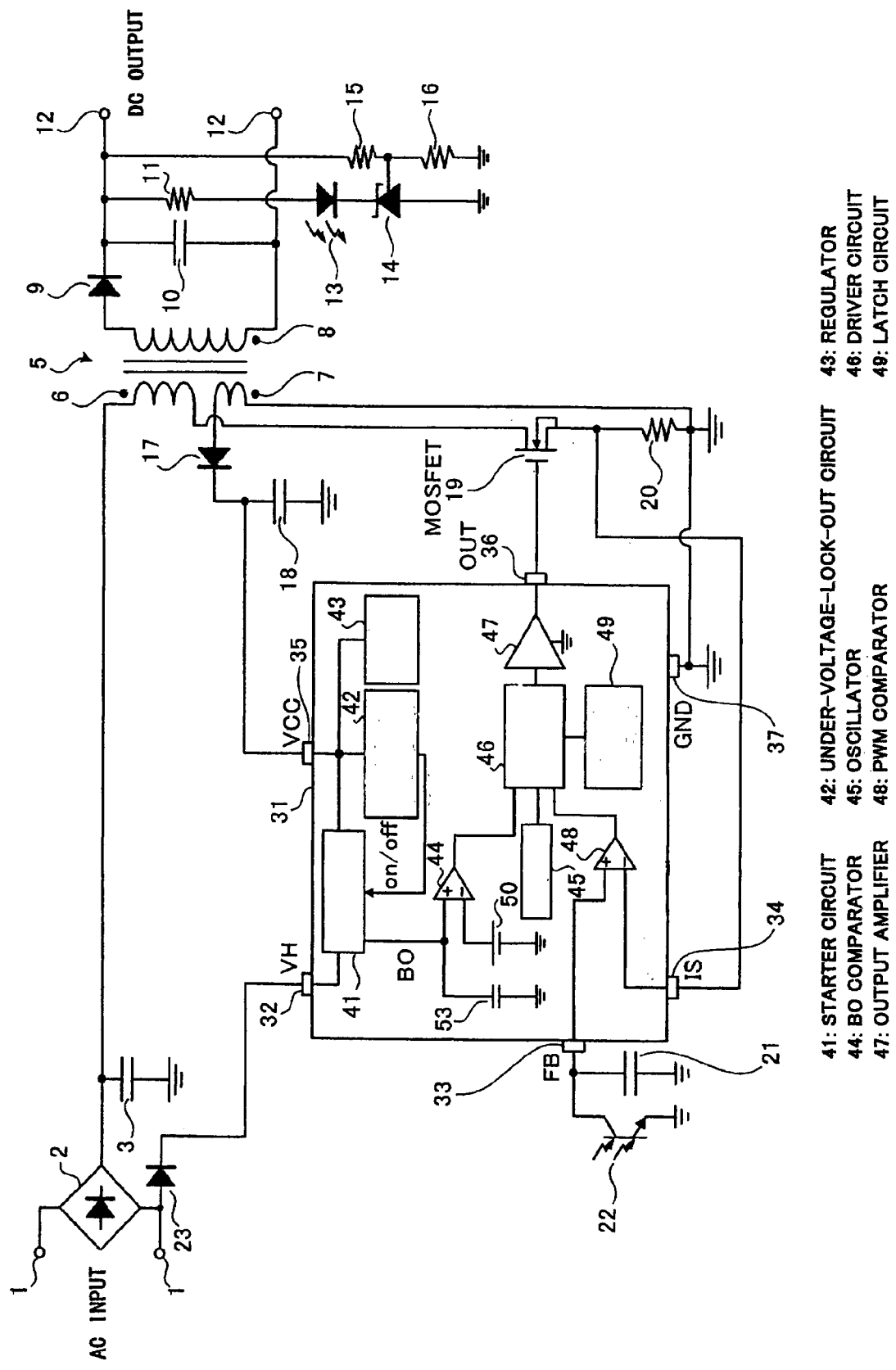
FIG. 8 is a block circuit diagram of another switching power supply according to the third embodiment of the invention.

FIG. 8 is a block circuit diagram of another switching power supply according to the third embodiment of the invention. The configuration shown in FIG. 8 includes smoothing capacitor 53 additionally connected to the non-inverting input terminal of BO comparator 44 in substitution for the smoothing circuit externally added to control IC 31 in the configuration shown in FIG. 7. Therefore, the configuration shown in FIG. 8 does not include capacitor 24, first resistor 25 nor second resistor 26. In FIG. 8, VH terminal 32 of control IC 31 is connected to the cathode terminal of diode 23 connected to one of AC input terminals 1.

When any voltage is not fed from the AC input in the configuration shown in FIG. 8, the voltage at VH terminal 32 of control IC 31 lowers and, therefore, the voltage at BO terminal 62 of starter circuit 41, that is the voltage input to the non-inverting input terminal of BO comparator 44, lowers. By connecting smoothing capacitor 53 to the non-inverting input terminal of BO comparator 44 as shown in FIG. 8, the primary-side voltage is detected accurately even when the voltage at the BO terminal 62 lowers.

Figure 9:
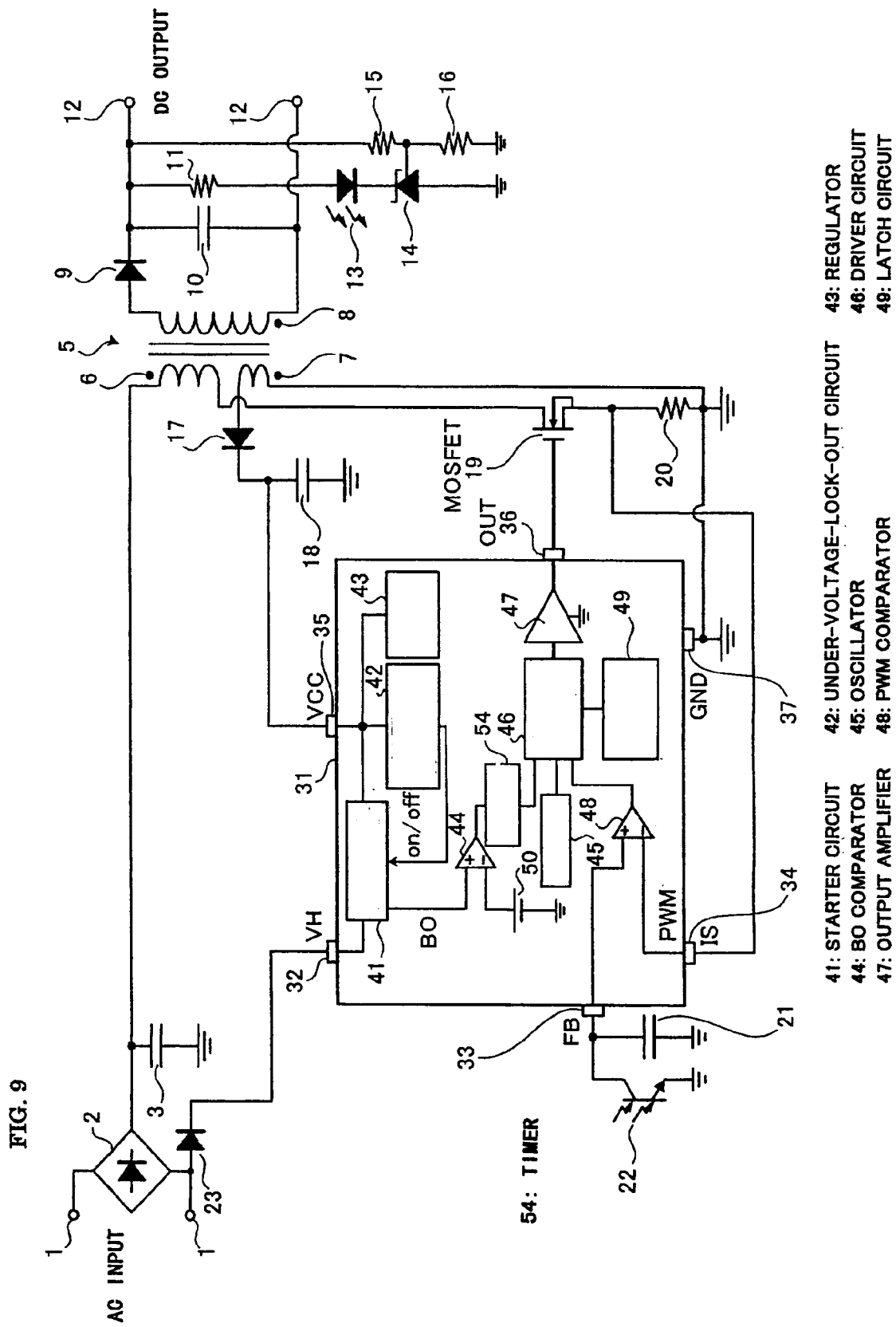
FIG. 9 is a block circuit diagram of still another switching power supply according to the third embodiment of the invention.

FIG. 9 is a block circuit diagram of still another switching power supply according to the third embodiment of the invention. The configuration shown in FIG. 9 does not include any externally-added smoothing circuit in the same manner as the configuration shown in FIG. 8. In FIG. 9, VH terminal 32 of control IC 31 is connected to the cathode terminal of diode 23 and timer 54 is added between the output terminal of BO comparator 44 and driver circuit 46 in substitution for the smoothing circuit added externally.

Timer 54 counts the period of time, for which the voltage at the non-inverting input terminal of BO comparator 44 is lower than the voltage at the inverting input terminal thereof due to the voltage lowering at VH terminal 32 of control IC 31. When the counted period of time is much longer than 20 ms that is the period of the commercial power supply, the timer 54 makes driver circuit 46 stop the switching operation of MOSFET 19. In other words, timer 54 makes the brownout function work.

Fourth Embodiment

Figure 10:
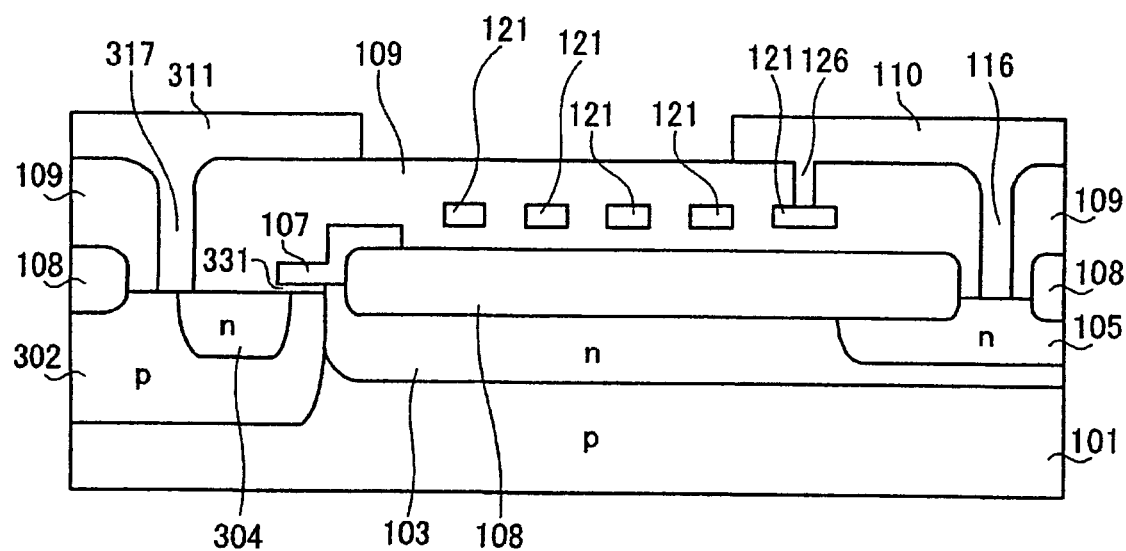
FIG. 10 is a cross sectional view of a semiconductor device according to a fourth embodiment of the invention.
Figure 11:
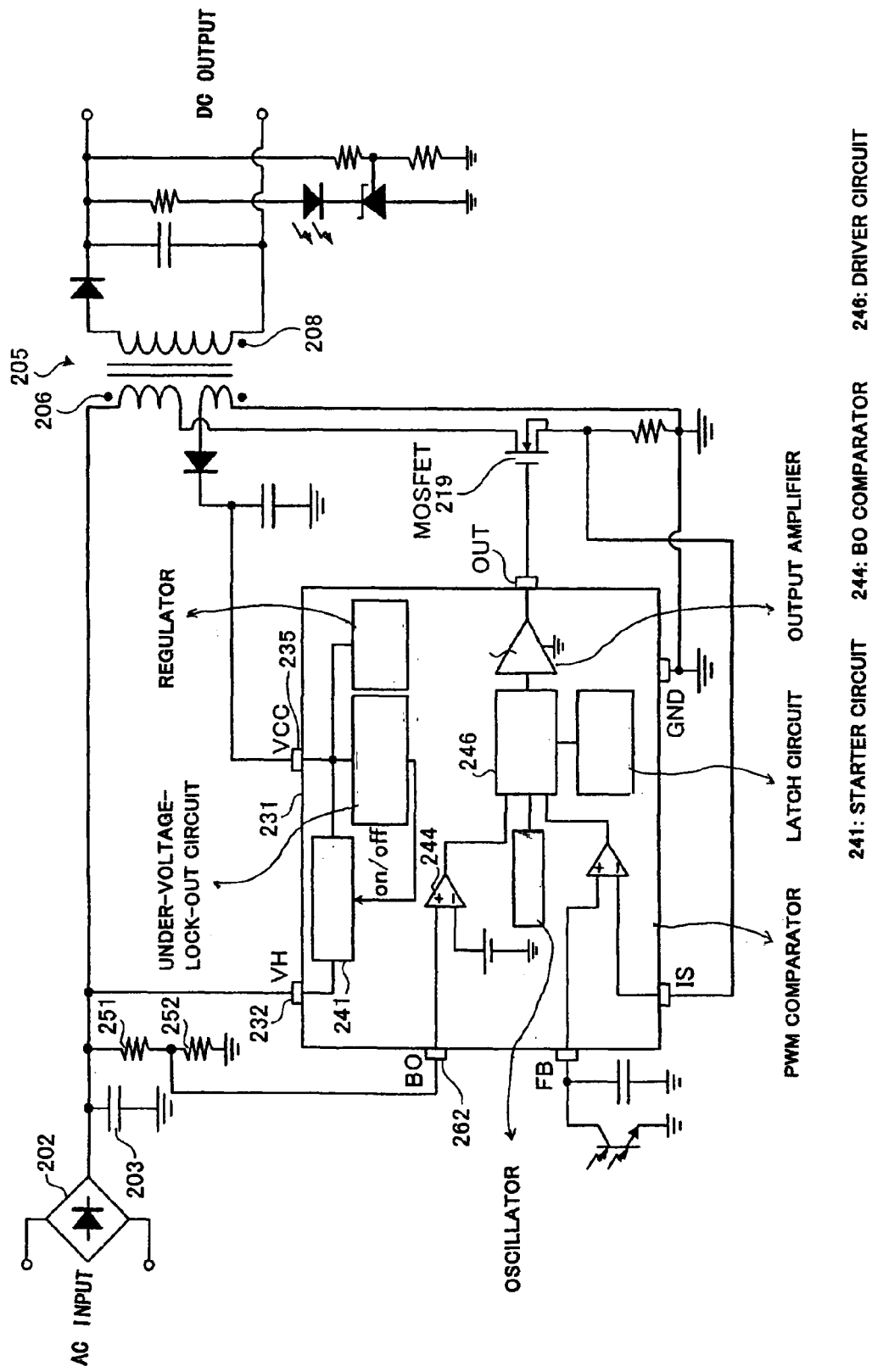
FIG. 11 is a block circuit diagram of a conventional switching power supply.
Figure 12:
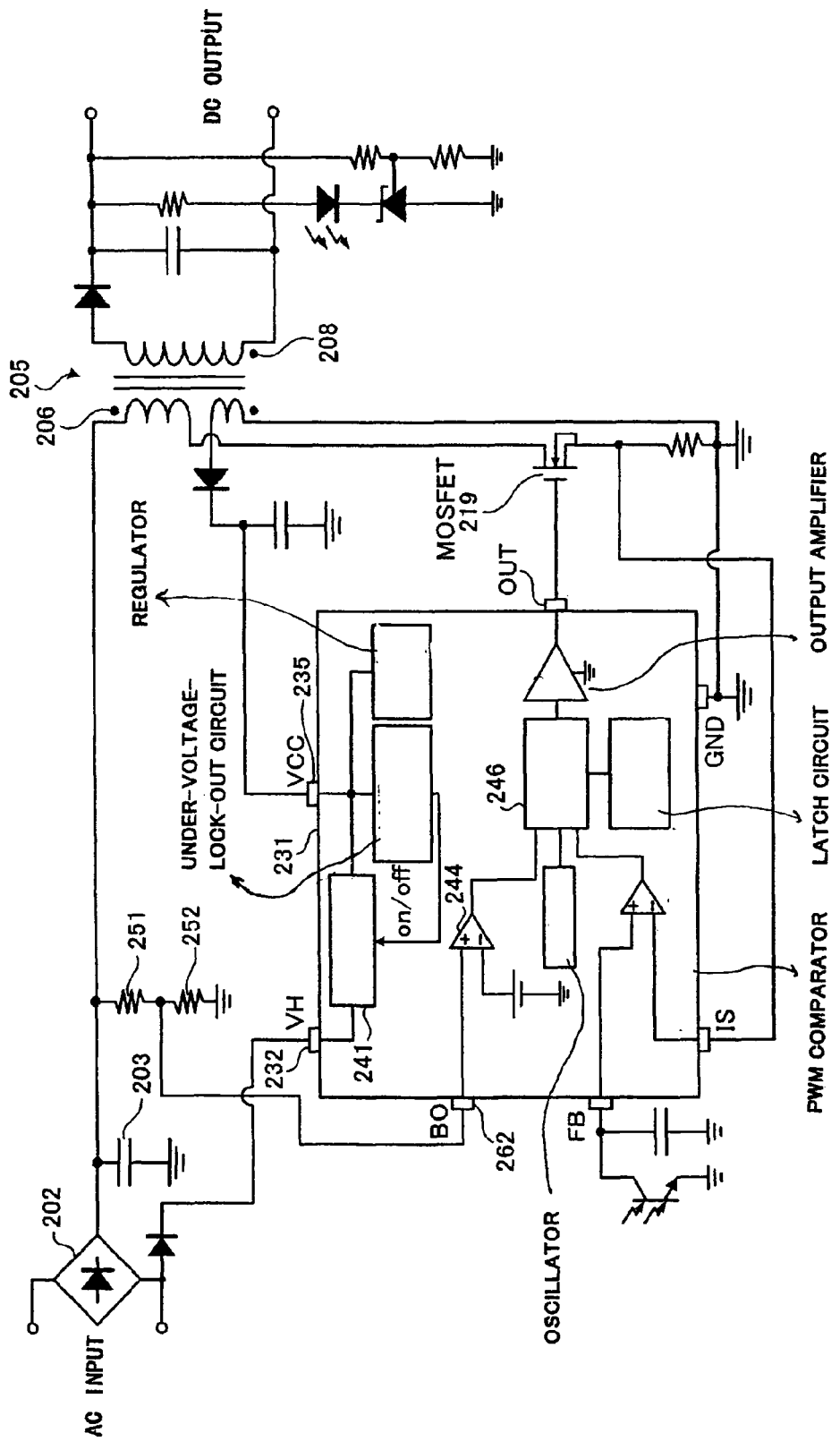
FIG. 12 is a block circuit diagram of another conventional switching power supply.
Figure 13:
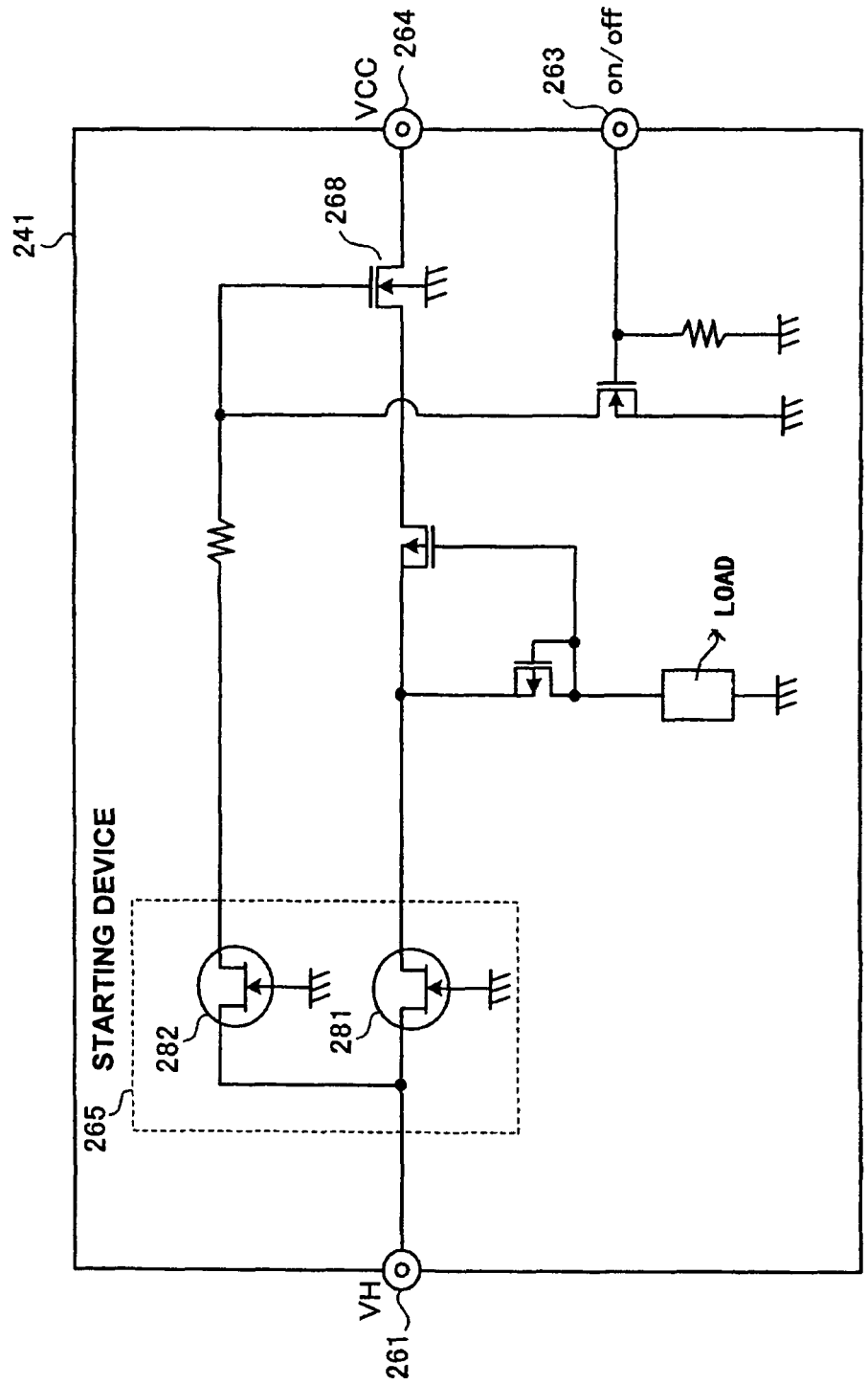
FIG. 13 is a circuit diagram of a starter circuit used in the conventional switching power supply.

FIG. 10 is a cross sectional view of a semiconductor device according to a fourth embodiment of the invention. As shown in FIG. 10, the semiconductor device according to the fourth embodiment employs N-channel insulated gate transistors (NMOSFETs) for the two field effect transistors exhibiting a high breakdown voltage and constituting staring device 65 in substitution for the junction transistors (JFETs 81 and 82 according to the second embodiment). The semiconductor device according to the fourth embodiment will be described hereinafter only in connection with the differences thereof from the semiconductor device according to the second embodiment.

The p-type well region that works as a gate region in the JFET corresponds to p-type base region 302 in the NMOSFET according to the fourth embodiment. P-type base region 302 works as a channel region, in which a channel is formed. Source region 304 is formed in the surface portion of p-type substrate 101 in p-type base region 302. Source region 304 is shaped with a flat ring formed on a circle spaced apart for an equal distance from drain region 105. In other words, many source regions are not formed but continuous source region 304 is formed according to the fourth embodiment.

Source region 104 in the semiconductor device according to the second embodiment is described in the cross sectional view shown in FIG. 4. Gate region 102 in the semiconductor device according to the second embodiment is described in the cross sectional view shown in FIG. 5. In any of the cross sectional views, p-type base region 302 and source region 304 in p-type base region 302 appear according to the fourth embodiment. Source region 304 and drain region 105 are simultaneously formed by diffusion to be shallower than drift region 103 and p-type base region 302. It is not always necessary to form drain region 105.

P-type base region 302 is in contact with drift region 103. Polysilicon gate electrode 107, which is a control electrode, is formed above the extended portion of p-type base region 302 extended between drift region 103 and source region 304 with gate insulator film 331 interposed between the extended portion of p-type base region 302 and gate electrode 107. Polysilicon gate electrode 107 is pulled out to the surface of interlayer insulator film 109 in the cross section different from the cross section shown in FIG. 10 and connected to the gate electrode wiring not shown in FIG. 10.

The metal wiring that works as source electrode wiring 311 is connected electrically to p-type base region 302 and source region 304 via source contact 317 formed through interlayer insulator film 109. Source electrode wiring 311 is divided into a plurality of sections to make continuous source region 304 work as a source region for the NMOSFET corresponding to first JFET 81 and as a source region for the NMOSFET corresponding to second JFET 82.

As described above, the NMOSFET corresponding to first JFET 81 and the NMOSFET corresponding to second JFET 82 are configured. In employing the semiconductor device according to the fourth embodiment for the starting device of a switching power supply, it is necessary to employ a control circuit configured such that the control circuit applies a voltage equal to or higher than the threshold voltage value to polysilicon gate electrode 107 in the period, for which the voltage across charged smoothing capacitor 18 (cf. FIG. 1) is between zero and 30 V, and grounds polysilicon gate electrode 107 in the period, for which the voltage across charged smoothing capacitor 18 is higher than 30 V.

Since resistors 73 and 74 are integrated into a semiconductor substrate as described above according to any of the second through fourth embodiments, control IC 31 that incorporates resistors 73 and 74 therein is obtained. Since the number of component parts added externally to IC 31 is reduced, the constituent parts costs, assembly costs and size of the switching power supply are reduced.

Resistors 73 and 74 are formed on starting device 65 according to any of the second through fourth embodiments. Resistors 73 and 74 may be incorporated in the control IC in the form of semiconductor device 65A according to the first embodiment. Since semiconductor device 65A is formed in the other region, in which starting device 65 is not formed, a wide chip area is caused inevitably in the alternative case. Still alternatively, the semiconductor device according to any of the second through fourth embodiment may be shaped with an athletic field in the two-dimensional shape thereof as shown in FIG. 19.

The control IC for improving the power factor (power-factor-improving IC) according to the first embodiment is exemplary. When an externally added resistor connected to a high voltage is incorporated in a semiconductor integrated circuit, the semiconductor device according to the first embodiment can be employed in any integrated circuit.

Although the invention has been described so far in connection with the embodiments thereof, changes and modifications are obvious to the skilled persons in the art without departing from the spirit and scope of the invention. For example, the numerical values described in connection with the embodiments are a exemplary and other numerical values may be adopted with no problem. Although the first conductivity type is a p-type and the second conductivity type is an n-type in the above descriptions, the invention is applicable to the semiconductor device, in which the first conductivity type is an n-type and the second conductivity type is a p-type.

What is claimed is:

1. A semiconductor device comprising:
   a semiconductor substrate of a first conductivity type;
   a drift region of a second conductivity type formed in a surface portion of the semiconductor substrate;
   a drain electrode connected to the drift region;
   a gate region of the first conductivity type formed selectively in the surface portion of the semiconductor substrate, the gate region surrounding a connection point of the drift region and the drain electrode, the gate region being in contact with the drift region;
   a plurality of source regions of the second conductivity type formed in the surface portion of the semiconductor substrate, the source regions extending into the gate region;
   a source electrode connected to the source regions, wherein the source electrode comprises a first source electrode connected to a first part of the source region and a second source electrode connected to a second part of the source region which is different part from the first part;
   an insulator film covering the gate region, the source regions, and the drift region;
   a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;
   a control electrode connected to the gate region; and
   a first resistance connection wiring, which is insulated from the source electrode, connected to a second end of the resistive element, wherein the source electrode comprises a first source electrode connected to a part of the source region and a second source electrode connected to a remaining part of the source region.

2. A semiconductor device comprising:
   a semiconductor substrate of a first conductivity type;
   a drift region of a second conductivity type formed in a surface portion of the semiconductor substrate;
   a drain electrode connected to the drift region;
   a gate region of the first conductivity type formed selectively in the surface portion of the semiconductor substrate, the gate region surrounding a connection point of the drift region and the drain electrode, the gate region being in contact with the drift region;
   a plurality of source regions of the second conductivity type formed in the surface portion of the semiconductor substrate, the source regions extending into the gate region;
   a source electrode connected to the source regions, wherein the source electrode comprises a first source electrode connected to a first part of the source region and a second source electrode connected to a second part of the source region which is different part from the first part;
   an insulator film covering the gate region, the source regions, and the drift region;
   a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;
   a control electrode connected to the gate region; and
   a first resistance connection wiring, which is insulated from the source electrode, connected to a second end of the resistive element, the semiconductor device further comprising a drain region of the second conductivity type formed in the surface portion of the semiconductor substrate between the drift region and the drain electrode.

3. A semiconductor device comprising:
   a semiconductor substrate of a first conductivity type;
   a drift region of a second conductivity type formed in a surface portion of the semiconductor substrate;
   a drain electrode connected to the drift region;
   a gate region of the first conductivity type formed selectively in the surface portion of the semiconductor substrate, the gate region surrounding a connection point of the drift region and the drain electrode, the gate region being in contact with the drift region;
   a plurality of source regions of the second conductivity type formed in the surface portion of the semiconductor substrate, the source regions extending into the gate region;
   a source electrode connected to the source regions, wherein the source electrode comprises a first source electrode connected to a first part of the source region and a second source electrode connected to a second part of the source region which is different part from the first part;
   an insulator film covering the gate region, the source regions, and the drift region;
   a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;
   a control electrode connected to the gate region; and
   a first resistance connection wiring, which is insulated from the source electrode, connected to a second end of the resistive element, wherein the source electrode comprises a first source electrode connected to a first source region group comprising one or more of the source regions and a second source electrode connected to a second source region group comprising remaining one or more of the source regions.

4. A semiconductor device comprising:
   a semiconductor substrate of a first conductivity type;
   a drift region of a second conductivity type formed in a surface portion of the semiconductor substrate;
   a drain electrode connected to the drift region;
   a gate region of the first conductivity type formed selectively in the surface portion of the semiconductor substrate, the gate region surrounding a connection point of the drift region and the drain electrode, the gate region being in contact with the drift region;

a plurality of source regions of the second conductivity type formed in the surface portion of the semiconductor substrate, the source regions extending into the gate region;

a source electrode connected to the source regions, wherein the source electrode comprises a first source electrode connected to a first part of the source region and a second source electrode connected to a second part of the source region which is different part from the first part;

an insulator film covering the gate region, the source regions, and the drift region;

a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;

a control electrode connected to the gate region; and a first resistance connection wiring, which is insulated from the source electrode, connected to a second end of the resistive element, wherein the resistive element is shaped with a flat spiral.

5. A semiconductor device comprising:

a semiconductor substrate of a first conductivity type;

a drift region of a second conductivity type formed in a surface portion of the semiconductor substrate;

a drain electrode connected to the drift region;

a gate region of the first conductivity type formed selectively in the surface portion of the semiconductor substrate, the gate region surrounding a connection point of the drift region and the drain electrode, the gate region being in contact with the drift region;

a plurality of source regions of the second conductivity type formed in the surface portion of the semiconductor substrate, the source regions extending into the gate region;

a source electrode connected to the source regions, wherein the source electrode comprises a first source electrode connected to a first part of the source region and a second source electrode connected to a second part of the source region which is different part from the first part;

an insulator film covering the gate region, the source regions, and the drift region;

a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;

a control electrode connected to the gate region; and a first resistance connection wiring, which is insulated from the source electrode, connected to a second end of the resistive element, wherein the resistive element is made of polysilicon.

6. A semiconductor integrated circuit comprising:

an input terminal, thereto a voltage is inputted; and a voltage-dividing resistance circuit dividing the voltage inputted from the input terminal, the voltage-dividing resistance circuit comprising a resistive element;

wherein the resistive element comprises a semiconductor device including:

a semiconductor substrate of a first conductivity type;

a drift region of a second conductivity type formed in a surface portion of the semiconductor substrate;

a drain electrode connected to the drift region;

a channel region of the first conductivity type formed selectively in the surface portion of the semiconductor substrate, the channel region surrounding a connection point of the drift region and the drain electrode, the channel region being in contact with the drift region;

a source region of the second conductivity type formed in a surface portion of the channel region;

a source electrode connected to the channel region and the source region, wherein the source electrode comprises a first source electrode connected to a first part of the source region and a second source electrode connected to a second part of the source region which is different part from the first part;

a control electrode controlling a channel formed in the surface portion of the channel region between the drift region and the source region;

an insulator film covering the channel region, the source region, and the drift region;

a resistive element, the resistive element being buried in the insulator film between the source region and the connection point of the drift region and the drain electrode, the resistive element comprising a first end connected to the drain electrode; and a first resistance connection wiring, which is insulated from the source electrode, connected to a second end of the resistive element.

7. A control IC controlling a switching power supply, the control IC comprising:

a starter circuit comprising:

a first field effect transistor exhibiting a breakdown voltage, the first field effect transistor comprising a drain terminal, thereto a primary-side voltage is applied from an outside, a gate terminal grounded, and a source terminal, therefrom the first field effect transistor makes a current flow based on the primary-side voltage applied to the drain terminal thereof;

a switching transistor connected to the source terminal of the first field effect transistor;

a second field effect transistor exhibiting a breakdown voltage, the second field effect transistor comprising a drain terminal, thereto the primary-side voltage is applied from the outside, a gate terminal grounded, and a source terminal, therefrom the second field effect transistor outputs a control signal, whereby to control the switching transistor; and a series resistance circuit comprising two resistors dividing the primary-side voltage applied to the drain terminals of the first and second field effect transistors, wherein the first field effect transistor, the second field effect transistor and the resistors comprise a semiconductor device that includes:

a semiconductor substrate of a first conductivity type;

a drift region of a second conductivity type formed in a surface portion of the semiconductor substrate;

a drain electrode connected to the drift region;

a gate region of the first conductivity type formed selectively in the surface portion of the semiconductor substrate, the gate region surrounding a connection point of the drift region and the drain electrode, the gate region being in contact with the drift region;

a plurality of source regions of the second conductivity type formed in the surface portion of the semiconductor substrate, the source regions extending into the gate region;

a source electrode connected to the source regions;
an insulator film covering the gate region, the source regions, and the drift region;
a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;
a control electrode connected to the gate region; and
a first resistance connection wiring connected to a second end of the resistive element,
wherein the source electrode comprises a first source electrode connected to a first source region group comprising one or more of the source regions and a second source electrode connected to a second source region group comprising remaining one or more of the source regions,
wherein the drain terminal of the first field effect transistor is connected to the drain electrode of the semiconductor device, the gate terminal of the first field effect transistor is connected to the control electrode of the semiconductor device, and the source terminal of the first field effect transistor is connected to the first source electrode of the semiconductor device;
wherein the drain terminal of the second field effect transistor is connected to the drain electrode of the semiconductor device, the gate terminal of the second field effect transistor is connected to the control electrode of the semiconductor device, and the source terminal of the second field effect transistor is connected to the second source electrode of the semiconductor device;
wherein one of the resistors, thereto the primary-side voltage is applied, comprises a section of the resistive element between a connection point thereof with the drain electrode and a connection point thereof with the second resistance connection wiring; and
wherein the other one of the resistors grounded comprises a section of the very resistive element between the connection point thereof with the second resistance connection wiring and a connection point thereof with the first resistance connection wiring.

8. The control IC according to claim 7, wherein the first field effect transistor, the second field effect transistor and the two resistors are integrated into a semiconductor substrate.

9. A switching power supply comprising:
an AC input;
a DC output; and
a control IC coupled between the AC input and the DC output, wherein the control IC includes:
a starter circuit comprising:
a first field effect transistor exhibiting a breakdown voltage, the first field effect transistor comprising a drain terminal, thereto a primary-side voltage is applied from an outside, a gate terminal grounded, and a source terminal, therefrom the first field effect transistor makes a current flow based on the primary-side voltage applied to the drain terminal thereof;
a switching transistor connected to the source terminal of the first field effect transistor;
a second field effect transistor exhibiting a breakdown voltage, the second field effect transistor comprising a drain terminal, thereto the primary-side voltage is applied from the outside, a gate terminal grounded, and a source terminal, therefrom the second field effect transistor outputs a control signal, whereby to control the switching transistor; and
a series resistance circuit comprising two resistors dividing the primary-side voltage applied to the drain terminals of the first and second field effect transistors, wherein the first field effect transistor, the second field effect transistor and the resistors comprise a semiconductor device that includes:
a semiconductor substrate of a first conductivity type;
a drift region of a second conductivity type formed in a surface portion of the semiconductor substrate;
a drain electrode connected to the drift region;
a gate region of the first conductivity type formed selectively in the surface portion of the semiconductor substrate, the gate region surrounding a connection point of the drift region and the drain electrode, the gate region being in contact with the drift region;
a plurality of source regions of the second conductivity type formed in the surface portion of the semiconductor substrate, the source regions extending into the gate region;
a source electrode connected to the source regions;
an insulator film covering the gate region, the source regions, and the drift region;
a resistive element, the resistive element being buried in the insulator film in a region between the drain electrode and the gate region or in a region between the drain electrode and the source regions, the resistive element comprising a first end connected to the drain electrode, wherein the resistive element is not connected to the source electrode;
a control electrode connected to the gate region; and
a first resistance connection wiring connected to a second end of the resistive element;
wherein the source electrode comprises a first source electrode connected to a first source region group comprising one or more of the source regions and a second source electrode connected to a second source region group comprising remaining one or more of the source regions;
wherein the drain terminal of the first field effect transistor is connected to the drain electrode of the semiconductor device, the gate terminal of the first field effect transistor is connected to the control electrode of the semiconductor device, and the source terminal of the first field effect transistor is connected to the first source electrode of the semiconductor device;
wherein the drain terminal of the second field effect transistor is connected to the drain electrode of the semiconductor device, the gate terminal of the second field effect transistor is connected to the control electrode of the semiconductor device, and the source terminal of the second field effect transistor is connected to the second source electrode of the semiconductor device;
wherein one of the resistors, thereto the primary-side voltage is applied, comprises a section of the resistive element between a connection point thereof with the drain electrode and a connection point thereof with the second resistance connection wiring; and
wherein the other one of the resistors grounded comprises a section of the resistive element between the connection point thereof with the second resistance connection wiring and a connection point thereof with the first resistance connection wiring.

10. The switching power supply according to claim 9, wherein the first field effect transistor, the second field effect transistor and the two resistors are integrated into a semiconductor substrate.

* * * * *